United States Patent [19]

Hotta et al.

[11] Patent Number: 6,040,999
[45] Date of Patent: Mar. 21, 2000

[54] SEMICONDUCTOR MEMORY DEVICE

[75] Inventors: Yasuhiro Hotta, Nara; Shuichiro Kouchi, Tenri, both of Japan

[73] Assignee: Sharp Kabushiki Kaisha, Osaka, Japan

[21] Appl. No.: 08/954,174

[22] Filed: Oct. 20, 1997

[30] Foreign Application Priority Data

Oct. 24, 1996 [JP] Japan .................................. 8-282767

[51] Int. Cl.[7] .............................. G11C 7/00; G11C 8/00
[52] U.S. Cl. ...................................... 365/200; 365/230.03
[58] Field of Search ............................. 365/200, 185.09, 365/185.11, 185.12, 230.03, 225.7

[56] References Cited

U.S. PATENT DOCUMENTS

| 5,452,258 | 9/1995 | Hotta | 365/230.03 |
| 5,483,491 | 1/1996 | Yoshioka et al. | 365/200 |
| 5,561,632 | 10/1996 | Arase et al. | 365/200 |
| 5,619,473 | 4/1997 | Hotta | 365/230.03 |
| 5,654,922 | 8/1997 | Arase et al. | 365/200 |

*Primary Examiner*—Trong Phan
*Attorney, Agent, or Firm*—Morrison & Foerster LLP

[57] ABSTRACT

A semiconductor memory device includes a main memory section, a redundant memory section, a memory cell selection section, a sensing amplification section, a data replacement section, and a data selection section. The redundant memory section includes a replacement cell data memory section for storing replacement cell data to replace cell data in a prescribed memory cell in the main memory section, and a control signal generation section for generating a control signal based on an input address. The memory cell selection section simultaneously selects prescribed cells as a plurality of memory cells corresponding to a prescribed page in the main memory section based on the input address. The sensing amplification section simultaneously senses cell data corresponding to a selected plurality of memory cells as page data. A supply of the replacement cell data and the control signal from the redundant memory section to the data replacement section is performed in a time period from the time when the input address is determined until a time when the page data to be output from the sensing amplification section is determined.

10 Claims, 17 Drawing Sheets

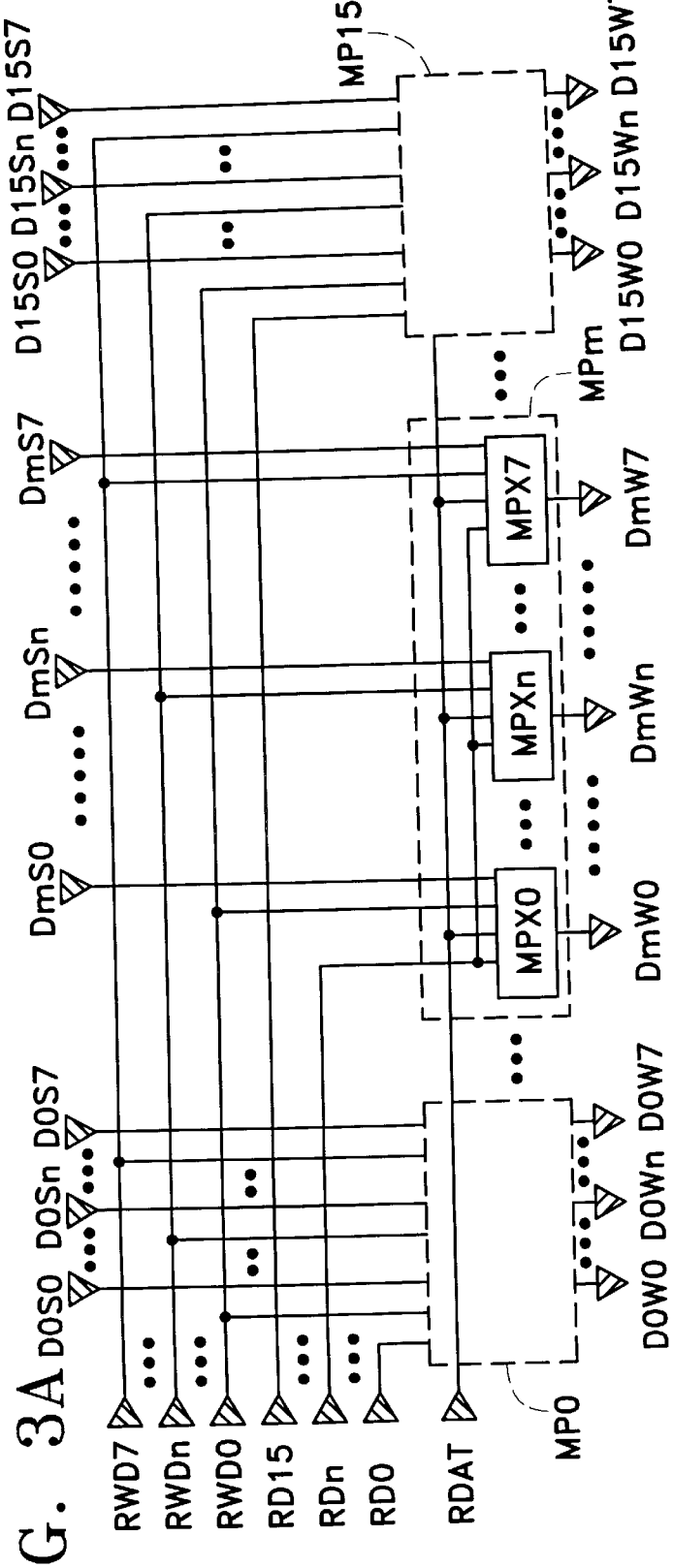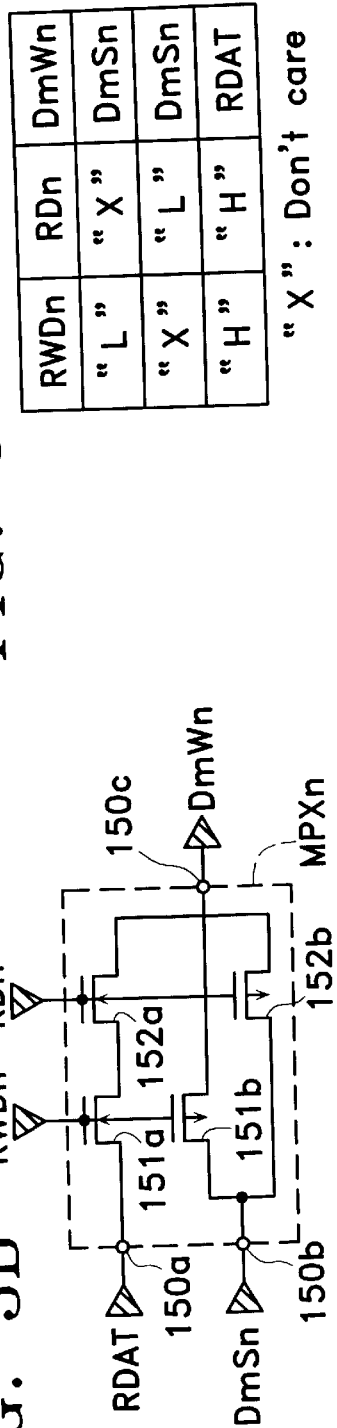

SEMICONDUCTOR MEMORY DEVICE

BACKGROUND OF THE INVENTION

1. Field of the Invention

The present invention relates to a semiconductor memory device, and specifically to a semiconductor memory device having a high-speed read mode adopting a redundancy compensation system, in which data in a defective memory cell is compensated for without delay in access time in the high-speed read mode.

2. Description of the Related Art

Recently, as the operation of the microprocessor has become faster, faster-operating semiconductor memory devices have been strongly demanded. While faster usual random access is now being developed on one hand, a semiconductor memory device having a high-speed read mode referred to as the "page mode" is being developed on the other hand as described in, for example, Japanese Laid-Open Publication No. 8-63990.

In the page-mode read operation, a plurality of memory cells, the number of which corresponds to a plurality of addresses in the memory cell arrays in accordance with the column address and the row address in an input address, are simultaneously selected. Data in the selected plurality of memory cells is simultaneously read into a sensing amplifier as one-page data. When the address for the page mode is changed in the state where the one-page data has been read into the sensing amplifier, the cell data at the corresponding address is switched at a fast speed from the selected one-page data and sequentially output.

There are other read modes than the page mode, such as the burst mode, the serial mode, and the like. These modes are similar to the page mode in that groups of data are read at a high speed, and thus are included in the scope of the present invention.

FIG. 12 is a block diagram illustrating a conventional non-volatile memory operable in a page mode. Specifically, FIG. 12 illustrates a general configuration for performing the page-mode operation in a mask ROM (read-only memory in which stored data is set at the production stage). FIG. 13 shows a detailed configuration of a memory cell array included in a main memory of the mask ROM.

As shown in FIG. 12, a mask ROM 200 operable in a conventional page mode receives an address signal (A0 through A19) and outputs 16-bit output data DO. The mask ROM 200 has a main memory section 10 in which memory cells Mmijn are arranged in a matrix. The memory cells Mmijn are divided into memory cell arrays MA0, MA1, ... MAm, ... MA15, each corresponding to one bit of the output data DO. The memory cell arrays MA0 through MA15 respectively output read cell data DO0, DO1, ... DOm, ... DO15, each corresponding to one bit of the output data DO.

The mask ROM 200 includes a row selector for selecting memory cells of a row corresponding to the row address (A7 through A19) of the input address signal, and a column selector for selecting memory cells of a plurality of columns corresponding to the column address (A3 through A6) of the input address signal. The row selector includes an input buffer 11 for receiving the row address (A7 through A19), a pre-row decoder (PRD) 12 connected to an output of the input buffer 11, and an X decoder 13 for selecting a row in the memory cell arrays based on the output from the pre-row decoder 12. The column selector includes an input buffer 21 for receiving the column address (A3 through A6), a pre-column decoder (PCD) 22 connected to an output of the input buffer 21, and a Y decoder section 23 for selecting a plurality of columns in the main memory section 10 (memory cell arrays MA0 through MA15) based on the output from the pre-column decoder 22.

The Y decoder section 23 includes a plurality of Y decoders YD0, YD1, ... YDm, ... YD15 respectively corresponding to the memory cell arrays MA0 through MA15. Each of the Y decoders YD0 through YD15 outputs read cell data DmB0, DmB1, ... DmBn, ... DmB7 (m=0 through 15) as one-page data from the memory cells Mmij0, Mmij1, ... Mmijn, ... Mmij7 of a prescribed row of the plurality of columns simultaneously selected from each of the memory cell arrays MA0 through MA15.

The Y decoders YD0 through YD15 are respectively connected to sensing amplifier groups SAG0, SAG1, ... SAGm, ... SAG15 for sensing read cell data D0Bn through D15Bn (n: an integer from 0 through 7) from the memory cell arrays MA0 through MA15. The sensing amplifier groups SAG0 through SAG15 each include a plurality of (eight in this example) sensing amplifiers. The sensing amplifier groups SAG0, SAG1, ... SAGm, ..., SAG15 are respectively connected to selectors SLN0, SLN1, ... SLNm, ... SLN15 for selecting sense cell data D0Sn through D15Sn (n: an integer from 0 through 7) from the respective sensing amplifiers based on a sensing amplifier selection signal Pn (n: an integer from 0 through 7) which is based on an address (A0 through A2) for the page mode.

The sensing amplifier selection signal Pn (n=0 through 7) is supplied to the selectors SLN0 through SLN15 by a page mode decoder (PMD) 32, and the page-mode decoder 32 receives the in-page address (i.e., address for the page mode; A0 through A2) via an input buffer 31.

The selectors SLN0 through SLN15 are respectively connected to output circuits OUT0, OUT1, ... OUTm, ... OUT15. The output circuits OUT0 through OUT15 perform signal processing, such as amplification, of cell data D0 through D15 selected by the selectors SLN0 through SLN15, and output the resultant signals as output cell data DO0 through DO15.

Next, specific configurations of the memory cell array MAm and the Y decoder YDm will be described.

FIG. 13 shows a detailed configuration of the memory cell array MAm among the memory cell arrays MA0 through MA15 included in the main memory section 10, and FIG. 14 shows a detailed configuration of the Y decoder YDm among the Y decoders YD0 through YD15 included in the Y decoder section 23, as well as the memory cell array MAm.

As shown in FIGS. 13 and 14, the memory cell array MAm includes a plurality of memory cells Mmijn in a matrix of 128 (horizontal)×8192 (vertical). The number 128 corresponds to 8 words×16 pages, and the number 8192 corresponds to 16 rows×512 banks. In the mask ROM 200, the memory cell array MAm is divided into a plurality of bank areas 10a. The bank areas 10a are arranged in a matrix of 512 (vertical)×128 (horizontal). In each bank area 10a, 16 memory cells are arranged vertically. Rows of the plurality of bank areas 10a arranged horizontally (hereinafter, referred to as "bank rows") R1, R2, ... Rk, ... R512 are each provided with 16 word lines WL0 through WL15. Each word line WLi (i: an integer of 0 through 15) is connected to gates of transistors (memory transistors) included in the memory cells Mmijn (i: an integer of 0 through 15) in the corresponding bank area 10a.

Between each two bank areas 10a adjacent to each other horizontally, a sub ground line SG formed of a diffusion layer is provided common to both of the bank areas 10a. On the other side of each bank area 10a, sub bit lines SB0 and SB1 formed of a diffusion layer are provided in correspondence with the respective bank area 10a. A main ground line MG formed of a metal layer is provided common to each two adjacent vertical columns of the bank areas 10a. The sub ground line SG common to two horizontally adjacent bank areas 10a is connected to the main ground line MG via a ground-side bank selection transistor TB1. Main bit lines MB0 and MB1 are provided in correspondence with the respective vertical column of the two adjacent columns of the bank areas 10a. The sub bit lines SB0 and SB1 provided for the respective bank areas 10a are connected to the main bit lines MB0 and MB1 via a supply-side selection transistor TB0.

To gates of the bank selection transistors TB0 and TB1, bank selection lines BS0 and BS1 are respectively connected. The bank selection lines BS0 and BS1 and the word lines WL0 through WO15 are driven by the X decoder 13.

The main bit lines MB respectively corresponding to columns of a plurality of bank areas 10a arranged vertically (hereinafter, referred to as the "bank columns") C1, C2, . . . Cr, . . . C128 are divided into groups. Each group includes 16 adjacent main bit lines MB corresponding to 16 adjacent bank columns. The first through 16th bit lines MBj (j: an integer of 0 through 15) of each group are connected to output terminals Y0, Y1, . . . , Yn, . . . Y7 of the Y decoder (the output terminals Y0, Y1, Yn, . . . Y7 corresponds to the group) via column selection transistors TC0, TC1, . . . TCj, . . . TC15 of the Y decoder (FIG. 14). To gates of the column selection transistors TC0 through TC15, column selection lines CS0 through CS15 are respectively connected. The column selection lines CS0 through CS15 are driven by the pre-column decoder 22.

According to the above-described configuration, when prescribed bank selection lines BS0 and BS1 and a prescribed word line WLi are selected by the X decoder 13 based on the row address (A7 through A19), a prescribed bank row Rk is selected, and also the memory cells in a prescribed bank row Rk in each of the bank areas 10a belonging to the selected bank row Rk are selected. Then, when a prescribed column selection line CSj is selected by the pre-column decoder 22 based on the column address (A3 through A6), a prescribed bit line MBj in each group is selected. In this manner, based on the row address (A7 through A19) and the column address (A3 through A6), data in the memory cells Mmij0 through Mmij7 in the memory cell array MAm is output as one-page data, namely, read cell data DmB0 through DmB7, from the Y decoder YDm to the sensing amplifier group SAGm.

In the above description, the detailed configurations of the memory cell array MAm and the Y decoder YDm corresponding to the memory cell array MAm are explained. The other memory cell arrays MA0, MA1, . . . and the Y decoders YD0, YD1, . . . corresponding thereto have the same configurations as those of the memory cell array MAm and the Y decoder YDm.

Hereinafter, the operation of the mask ROM 200 will be described.

FIG. 15 is a timing diagram illustrating the read operation in the page mode.

In the mask ROM 200, when input of an input address (A0 through A19) is determined at time t0, page data of page P(h) corresponding to a prescribed page address (h) is read to each of the sensing amplifier groups SAG0 through SAG15 as read cell data D0Bn through D15Bn (n=0 through 7). The data read from the memory cells in this case is performed in a usual random access mode as follows.

First, when the row address (A7 through A19) is determined, the bank selection lines BS0 and BS1 for selecting one of the bank rows Rk among the bank rows R1 through R512 and one word line WLi among the word lines WL0 through WL15 in the selected bank row Rk are driven by the X decoder 13. At this point, the bank selection lines BS0 and BS1 and the word line WLi become active ("high" level).

When the column address (A3 through A6) is determined, one column line CSj among the column lines CS0 through CS15 of each group is driven by the pre-column decoder 22, and the signal level of the one column line CSj becomes active ("high" level). The column selection transistor TCj which receives a signal from the column selection line CSj becomes "ON".

The memory cells Mmij0, Mmij1, . . . Mmij7 (m=0 through 15) in the selected row and bank columns are selected in each memory cell array, and the cell data in each memory cell is input to the sensing amplifier groups SAG0 through SAG15 via the column selection transistors TCj.

Next, at time t1, sensing amplifier outputs DmS0, DmS1, . . . DmS7 (m=0 through 15) from the sensing amplifier groups SAG0 through SAG15 (i.e., the sensing amplifier groups SAGm) are determined. Thus, the read of the page data PD(h) at address h designated by the address signal (A3 through A19) is completed.

Since only one of the output signals P0, P1, . . . , P7 from the page mode decoder 32 becomes active ("high" level) in accordance with the in-page address (A0 through A2), one of the sensing amplifier outputs DmSn among the sensing amplifier outputs DmS0 through DmS7 (m=0 through 15) from the corresponding sensing amplifier group SAGm (m=0 through 15) is selected by each selector SLNm (m=0 through 15). Thus, a first word W0 in the page data PD(h) at address h, i.e., data in the memory cell Mjij0 in the memory cell array MAm (m=0 through 15) corresponding to each data bit is output to the output circuit OUTm (m=0 through 15) corresponding to each bit. (time t2)

Then, when the in-page address (A0 through A2) starts changing at time t3, data in the sensing amplifier output DmSn (n=0 through 7) is sequentially selected by each selector SLNm. When the output signal (P0 through P7) from the page mode decoder 32 is determined at time t4, a second word W1 in the page data PD(h) at address h, i,e., data in the memory cell Mmij1 in the memory cell array MAm (m=0 through 15) corresponding to each data bit is output to the output terminal DOm of each output circuit OUTm.

After that, each time the in-page address (A0 through A2) changes and the sensing amplifier selecting signal (P0 through P7) from the page mode decoder 32 is determined, a third word W2 through an eighth word W7 in the page data PD(h) at address h are sequentially output to the output terminal DOm of each output circuit OUTm.

As described above, after the page data is determined by random access and the first word of the page data is determined, when a prescribed time period has passed since the start of the change in the in-page address signal (A0 through A2), the mask ROM 200 goes into the page mode allowing the high-speed read. Thus, the data in the memory cell is output at a high speed.

Then, when the page address (A3 through A19) changes, page data PD(h+1) at address (h+1) is read to the sensing amplifier groups SAG0 through SAG15 again in the random access mode. After the first word in the page data PD(h+1) is determined, the mask ROM 200 goes into the page mode allowing the high-speed read. Thus, the data in the memory cell is output at a high speed.

As described above, when a page designating address signal, i.e., an inter-page address signal (A3 through A19) changes, determination of the data to be sent to the output terminal DOm (m=0 through 15) requires determination of the main bit line, an output of the sensing amplifier group, and an output of the selector. By contrast, when a word designation address signal, i.e., the in-page address (A0 through A2) changes, the data to be sent to the output terminal DOm is determined only after the time period required to switch the selector SLNm.

Accordingly, the mask ROM operable in the page mode allows high-speed read with respect to a change in the in-page address, thus realizing a high-speed read operation.

In the field of read-only memories, such as mask ROMs, a redundancy compensation system has already been developed in order to improve the production yield. Japanese Laid-Open Publication No. 6-76591, for example, discloses a mask ROM adopting a redundancy compensation system.

Such a mask ROM includes a redundant memory cell group having rewritable data memory devices, and a replacement address storage section having address memory devices for addresses into which the address of a defective memory cell group including a defective bit can be written. The address of the defective memory cell group is stored in the replacement address storage section, and thus the defective memory cell group is replaced with a redundant memory cell group.

FIG. 16 is a block diagram illustrating a conventional non-volatile memory adopting the above-described redundancy compensation system. Specifically, FIG. 16 illustrates a general configuration of such a read-only memory (mask ROM). FIG. 17 shows a detailed configuration of a memory cell array included in a main memory of the mask ROM.

In FIG. 16, reference numeral 300 denotes a mask ROM adopting a conventional redundancy compensation system. Identical elements previously discussed with respect to FIGS. 12 through 14 will bear identical reference numerals therewith and the descriptions thereof will be omitted. As the mask ROM 200 operable in the conventional page mode, the mask ROM 300 receives an address signal (A0 through A19) and outputs 16-bit output data DO. The mask ROM 300 has a main memory section 10 having the same configuration as in the mask ROM 200.

As shown in FIG. 17, the memory cell array MAm has the same configuration as in the mask ROM 200. Briefly, the memory cell array MAm includes a plurality of memory cells Mmit in a matrix of 128 (horizontal)×8192 (vertical). The number 128 corresponds to 8 words×16 pages, and the number 8192 corresponds to 16 rows×512 banks. The memory cell array MAm is divided into a plurality of bank areas 10a. The bank areas 10a are arranged in a matrix of 512 (vertical)×128 (horizontal). In each bank area 10a, 16 memory cells are arranged vertically.

The mask ROM 300 adopting the redundancy compensation system includes a redundant circuit section 300a for storing data to be stored in place of the defective memory cell group including a defective bit, in addition to the main memory section 10.

The redundant circuit section 300a stores replacement cell data, treating each bank area 10a as a unit (bank area by bank area). The redundant circuit section 300a includes a replacement bank address storage section 310 for storing the address of the bank area 10a including the defective memory cell to be replaced, a replacement cell data memory section 320 which can store pieces of data, the number of which corresponds to the number of memory cells included in the bank area 10a to be replaced, and a replacement bit designation storage section 330 for storing replacement bit designation data which designates the bit to be replaced among the sense cell data from the sensing amplifier corresponding to each bit.

The mask ROM 300 includes a row selection device including an input buffer 11, a pre-row decoder 12 and an X decoder 13 having the same configurations as in the mask ROM 200.

The mask ROM 300 includes a column selection device for selecting memory cells of a plurality of columns corresponding to the column address (A0 through A6) of an input address signal. The column selection device includes an input buffer 21a for receiving the column address (A0 through A6), a pre-column decoder (PCD) 22a connected to an output of the input buffer 21a, and a Y decoder section 23a for selecting a plurality of columns (corresponding to 16 bits) in the main memory section 10 (memory cell arrays MA0 through MA15) based on the output from the pre-column decoder 22a.

The Y decoder section 23a includes a plurality of Y decoders Yd0, Yd1, . . . Ydm, . . . Yd15 respectively corresponding to the memory cell arrays MA0 through MA15. From each of the Y decoders Yd0 through Yd15, read cell data Dmb (m: an integer of 0 through 15) from the memory cell Mmit of a prescribed row ("i"th row) of one column selected in each of the memory cell arrays MA0 through MA15 is output as output data corresponding to each bit.

The Y decoders Yd0 through Yd15 are respectively connected to sensing amplifiers SA0, SA1, . . . SAm, . . . SA15 for sensing read cell data D0b through D15b from the memory cell arrays MA0 through MA15. The sensing amplifiers SA0 through SA15 are respectively connected to selectors SL0, SL1, . . . SLm, . . . SL15 for selecting either one of sense cell data MDAT0 through MDAT15 from the respective sensing amplifiers SA0 through SA15 or the replacement cell data RDAT from the redundant circuit section 300a, based on the replacement bit designation data.

The selectors SL0 through SL15 are respectively connected to output circuits OUT0, OUT1, . . . OUTm, . . . OUT15 (hereinafter, referred to also as "output circuits" OUT0 through OUT15). The output circuits OUT0 through OUT15 perform signal processing, such as amplification, of cell data D0 through D15 selected by the selectors SL0 through SL15, and output the resultant signals as output cell data DO0 through DO15.

Hereinafter, the operation of the mask ROM 300 will be described.

The mask ROM 300 adopting the redundancy compensation system operates in the following manner in the case where a defective memory cell is included in a prescribed bank area in a prescribed memory cell array MAm.

First, the bank address (A0 through A6, A11 through A19) for designating the bank area including the defective memory cell to be replaced is stored in the replacement bank address storage section 310. The replacement bit designation data (D0 through D15) representing the bit of the 16-bit data which corresponds to the memory cell array including the defective memory cell is stored in the replacement bit designation storage section 330. Data to be stored in each memory cell in the defective bank area is stored in the replacement cell data memory section 320 in accordance with the address (A7 through A10) corresponding to the position in the bank area.

When prescribed bank selection lines BS0 and BS1 become active based on the row address (A7 through A19) of the input address signal at the time of reading data in the mask ROM 300, bank selection transistors TB0 and TB1 in each of the bank areas of a prescribed bank row Rk become conductive. Thus, the source and the drain of the memory transistor in each of the memory cells Mmit in each of the bank areas belonging to the bank row Rk are connected to main bit lines MB0 and MB1 and a main ground line MG via sub bit lines SB0 and SB1 and a sub ground line SG. Simultaneously, a prescribed word line WLi becomes active when the "i"th memory cell in each of the bank areas of the bank row Rk is selected.

When a main bit line corresponding to a prescribed bank column Cr (i.e., memory cell column) in each of the memory cell arrays MAm is selected by the Y decoder Ydm, information in the memory cell Mmit (t=r) selected in each of the memory cell arrays MAm is read as read cell data Dmb from each Y decoder Ydm to the sensing amplifier SAm corresponding to each bit.

In the case where there is no defective memory cell in the bank area selected in each memory cell array MAm, the sense cell data MDATm is selected by the selector SLm corresponding to each bit. The sense cell data MDATm is supplied as the selector output Dm to the output circuit OUTm corresponding to each bit and then output from the output circuit OUTm, the output data DOm as the cell data from the mask ROM 300.

By contrast, in the case where the input address externally provided matches the bank address stored in the replacement bank address storage section 310, the replacement cell data RDAT at the position corresponding to the word line which has become active among the data stored in the replacement cell data memory section 320 is read and supplied to each selector SLm. At this point, each selector SLm is supplied with replacement bit designation data by the replacement bit designation storage section 330. Accordingly, the selector SLm corresponding to the bit to be replaced replaces the cell data MDATm from the memory cell array MAm corresponding thereto with the replacement cell data RDAT and outputs the replacement cell data RDAT to the output circuit OUTm.

In order to enable replacement of any of m bits ($0 \leq m < 16$) of the data D0 through D15 simultaneously read, the selector needs to have a configuration which enables switching of the cell data MDATm (m: an integer of 0 through 15) from each memory cell array MAm in the main memory section 10 and the replacement cell data RDAT. Accordingly, in order to enable data replacement of any of a plurality of bits, e.g., m-bit data, the selectors each are required to be a switching circuit with a plurality of inputs corresponding to (m+1) bits.

In a hierarchical memory cell array having a sub bit line corresponding to each bank area and a main bit line corresponding to each bank column, generation of one defect (e.g., one defective memory cell) in the memory cell array makes it difficult to read data from other memory cells in the bank area including the defective memory cell.

The defect can be efficiently compensated for by treating the memory cells connected to the sub bit line and the sub ground line in the bank area as one unit as described above.

In the above description, a NOR-type mask ROM is explained as the mask ROM. The same effect can be obtained for a NAND-type, i.e., vertical mask ROM by setting a bank area as a prescribed number of memory cells arranged vertically.

In the above-described read-only memory operable in the page mode, the output is determined only after the time period required for switching the selector since the page address changes during page access. Thus, a high-speed operation is possible. However, in the case where the redundant circuit system is adopted in the mask ROM operable in the page mode, read of redundant data requires access time to the redundant memory and also the operation time of the switching circuit. Such a time period is longer than the page access time. Therefore, when the data read from the redundant memory occurs during page access, the access timing is restricted.

In the case where a non-volatile memory operable in the high-speed access mode such as page mode includes a redundant circuit, delay in data access due to the read of the redundant data and data switching makes it difficult to shorten the access time.

SUMMARY OF THE INVENTION

A semiconductor memory device of the present invention includes a main memory section for storing data, the main memory section including a plurality of memory cells arranged in a matrix; a redundant memory section including a replacement cell data memory section for storing replacement cell data to replace cell data in a prescribed memory cell in the main memory section, and a control signal generation section for generating a control signal for data replacement based on an input address; a memory cell selection section for simultaneously selecting prescribed cells as a plurality of memory cells corresponding to a prescribed page in the main memory section based on the input address; a sensing amplification section for simultaneously sensing the cell data corresponding to the selected plurality of memory cells as; page data; a data replacement section for receiving the replacement cell data and the control signal from the redundant memory section and also receiving the page data from the sensing amplification device; when the page data includes cell data which needs to be replaced, outputting replacement page data after replacing the cell data with the replacement cell data based on the control signal; and when the page data includes no cell data which needs to be replaced, outputting the page data with no processing based on the control signal; and a data selection section for sequentially switching and outputting the corresponding data from the page data output from the data replacement section based on the input address. A supply of the replacement cell data and the control signal from the redundant memory section to the data replacement section is performed in a time period from the time when the input address is determined until the time when the page data to be output from the sensing amplification section is determined.

In one embodiment of the invention, the main memory section includes a plurality of bank areas each including a prescribed number of memory cells, the bank area being used as a unit for reading the cell data. The replacement cell data memory section in the redundant memory section stores replacement cell data on a bank area-by bank area basis so as to include the replacement cell data corresponding to all the memory cells in a replacement target bank area including a memory cell to be replaced. The control signal generation section of the redundant memory section includes a determination section for determining whether or not a row of a plurality of memory cells arranged in a matrix which are simultaneously selected overlaps the replacement target bank area including the memory cell to be replaced; and when the row of the plurality of memory cells overlaps the replacement target bank area, controls the data replacement section to replace the cell data stored in the memory cell to be replaced with the replacement cell data.

In another embodiment of the invention, the control signal generation section of the redundant memory section includes a replacement page designation storage section for storing a page designation address which designates a replacement target page including the memory cell to be replaced in the maim memory section; and when a part of the input address which designates a page matches the page designation address, controls the data replacement section to replace the cell data stored in the memory cell to be replaced with the replacement cell data.

In still another embodiment of the invention, the main memory section includes a plurality of memory cell arrays each having the plurality of memory cells in a matrix, the plurality of memory cells corresponding to each of a plurality of bits of data so that data corresponding to a plurality of bits is allowed to be stored. The memory cell selection section includes a plurality of column selection devices for simultaneously selecting columns to which memory cells included in a page belong in the corresponding memory cell array, the plurality of column selection devices being provided respectively for the plurality of bits of the data. The sensing amplification device includes a plurality of sensing amplifier groups each including a plurality of sensing amplifiers, the plurality of sensing amplifier groups, respectively provided for the plurality bits of data, simultaneously sensing the cell data in the plurality of memory cells selected by the corresponding column selection device as the page data. The data replacement section includes a plurality of replacement circuits for performing data replacement of the page data output from the corresponding sending amplification section when necessary based on the control signal, the plurality of replacement circuits being respectively provided for the plurality of bits of data. The data selection section includes a plurality of selection circuits for sequentially switching and outputting cell data corresponding to each memory cell in the page data output from the corresponding replacement circuit based on the input address, the plurality of selection circuits being provided respectively for the plurality of bits of data. The control signal generation section of the redundant memory section further includes an in-page word designation storage section for storing an in-page word designation address which designates the memory cell to be replaced in the replacement target page, and also includes a replacement bit designation storage section for storing replacement bit designation data which designates a replacement bit to be replaced in the data corresponding to the plurality of bits read from the main memory section; and when a part of the input address which designates a page matches the page designation address stored in the replacement page designation storage section, outputs the in-page word designation address and the replacement bit designation data to each of the replacement circuits.

In still another embodiment of the invention, The replacement page designation storage section includes a plurality of page memory determination circuits, each storing one page designation address. The in-page word designation storage section includes a plurality of in-page word designation memory circuits each storing one in-page word designation address. The replacement bit designation storage section includes a plurality of replacement bit designation circuits each storing one piece of replacement bit designation data. The replacement cell data memory section includes a plurality of replacement cell data memory circuits each storing one piece of replacement cell data. The data replacement section is allowed to replace cell data for a plurality of pieces of page data based on the in-page word designation address and the replacement bit designation data.

In still another embodiment of the invention, the data replacement section is a multiplexer circuit including a plurality of replacement circuits for performing data replacement with respect to the page data output from the corresponding sensing amplifier group when necessary based on the control signal, the plurality of replacement circuits being provided respectively for the plurality of bits of data.

In still another embodiment of the invention, each data replacement circuit receives the page data from the corresponding sensing amplifier group and the replacement cell data stored in the replacement cell data memory section; when the in-page word designation address and the replacement bit designation data are active, replaces the cell data from each of the memory cells included in the page data from the sensing amplifier group with the replacement cell data stored in the replacement cell data memory section; and when the in-page word designation address and the replacement bit designation data are inactive, outputs the page data from the sensing amplifier group with no processing.

In still another embodiment of the invention, the replacement page designation storage section in one redundant memory section stores only one replacement page designation address.

In still another embodiment of the invention, the semiconductor memory device further includes another redundant memory section. At least two pieces of cell data from the plurality of memory cells in one piece of page data read from a prescribed sensing amplifier group is allowed to be replaced.

In still another embodiment of the invention, each bank area includes a plurality of memory cells arranged in a line in a direction perpendicular to the direction in which the memory cells included in a page are arranged.

According to the present invention, a supply of the replacement cell data and the control signal from the redundant memory section to the data replacement section is performed in a time period from the time when the input address is determined until the time when the page data to be output from the sensing amplification section is determined. Accordingly, data in a defective memory cell can be compensated for without delay in access time in a high-speed read mode.

In a structure in which the main memory section includes a plurality of bank areas each including a prescribed number of memory cells, the bank area is used as a unit for reading the cell data, and the replacement cell data memory section in the redundant memory section stores replacement cell data on a bank area-by bank area basis, in the case where the memory cells in the bank area are connected to a corresponding sub bit line, one defective memory cell makes it difficult to read data from the other memory cells connected to the same sub bit line as the defective memory cell. Accordingly, compensation for the defective part in the memory cell array can be efficiently performed.

In the case where the control signal generation section of the redundant memory section determines whether or not a row of a plurality of memory cells arranged in a matrix which are simultaneously selected overlaps the replacement target bank area including the memory cell to be replaced and thus controls replacement of the cell data stored in the memory cell with the replacement cell data. The above-described determination is conducted on a bank area-by-bank area basis. The time required for the determination can be shortened compared to the case where the determination is conducted on a memory cell-by-memory cell basis.

In a structure in which, when a part of the input address which designates a page matches the page designation address, the cell data stored in the memory cell to be replaced is replaced with the replacement cell data, it can be determined quickly whether the cell data needs to be replaced or not by simply determining a part of the input address.

In a structure in which, when a part of the input address which designates a page matches the page designation address stored in the replacement page designation storage section, the in-page word designation address and the replacement bit designation data are output to each of the replacement circuits, replacement of cell data in the defective memory cell is possible with respect the page data corresponding to any bit of the output data.

In a structure in which the redundant memory includes a plurality of page memory determination circuits, a plurality of in-page word designation memory circuits, a plurality of replacement bit designation circuits and a plurality of replacement cell data memory circuits, data replacement can be conducted with respect to a plurality of pieces of page data corresponding to the plurality of bits of data.

In a structure in which, as the data replacement section for performing data replacement with respect to the page data corresponding to each bit, a multiplexer circuit including a plurality of replacement circuits for performing data replacement with respect to the page data output from the corresponding sensing amplifier group is used, the data replacement section has a simple and compact circuit configuration.

In a structure in which each replacement circuit included in the data replacement section replaces the cell data in accordance with the signal levels of the in-page word designation address and the replacement bit designation data, cell data corresponding to a prescribed word in the page data corresponding to a prescribed bit can be replaced.

In a structure in which the replacement page designation storage section in one redundant memory section stores only one replacement page designation address, the capacity of the memory cell to be replaced can be restricted to be small whereas the cell data in a plurality of memory cells belonging to one page can be replaced.

In a structure in which the semiconductor memory device includes a plurality of redundant memory sections, so that at least two pieces of cell data from the plurality of memory cells in one piece of page data read from a prescribed sensing amplifier group is allowed to be replaced, at least two defective parts (defective words) in the page data corresponding to a prescribed bit can be compensated for.

In a structure in which each bank area includes a plurality of memory cells arranged in a line in a direction perpendicular to the direction in which the memory cells included in a page are arranged, a read of the replacement cell data from the replacement cell data memory section can be performed in a short period of time based on the row address of the bank area having a smaller amount of information than the row address of the memory cell and the page designation address having a smaller amount of information than the column address of the memory cell.

Thus, the invention described herein makes possible the advantage of providing a semiconductor memory device for compensating for data in a defective memory cell without delay in access time in a high-speed read mode.

This and other advantages of the present invention will become apparent to those skilled in the art upon reading and understanding the following detailed description with reference to the accompanying figures.

BRIEF DESCRIPTION OF THE DRAWINGS

FIG. 3A is a view illustrating an inner configuration of a multiplexer of the mask ROM shown in FIG. 1;

FIG. 3B is a view illustrating a specific configuration of a replacement circuit included in the multiplexer;

FIG. 3C is a view illustrating signals input to and output from the replacement circuit;

DESCRIPTION OF THE PREFERRED EMBODIMENTS

Example 1

Figure 1:
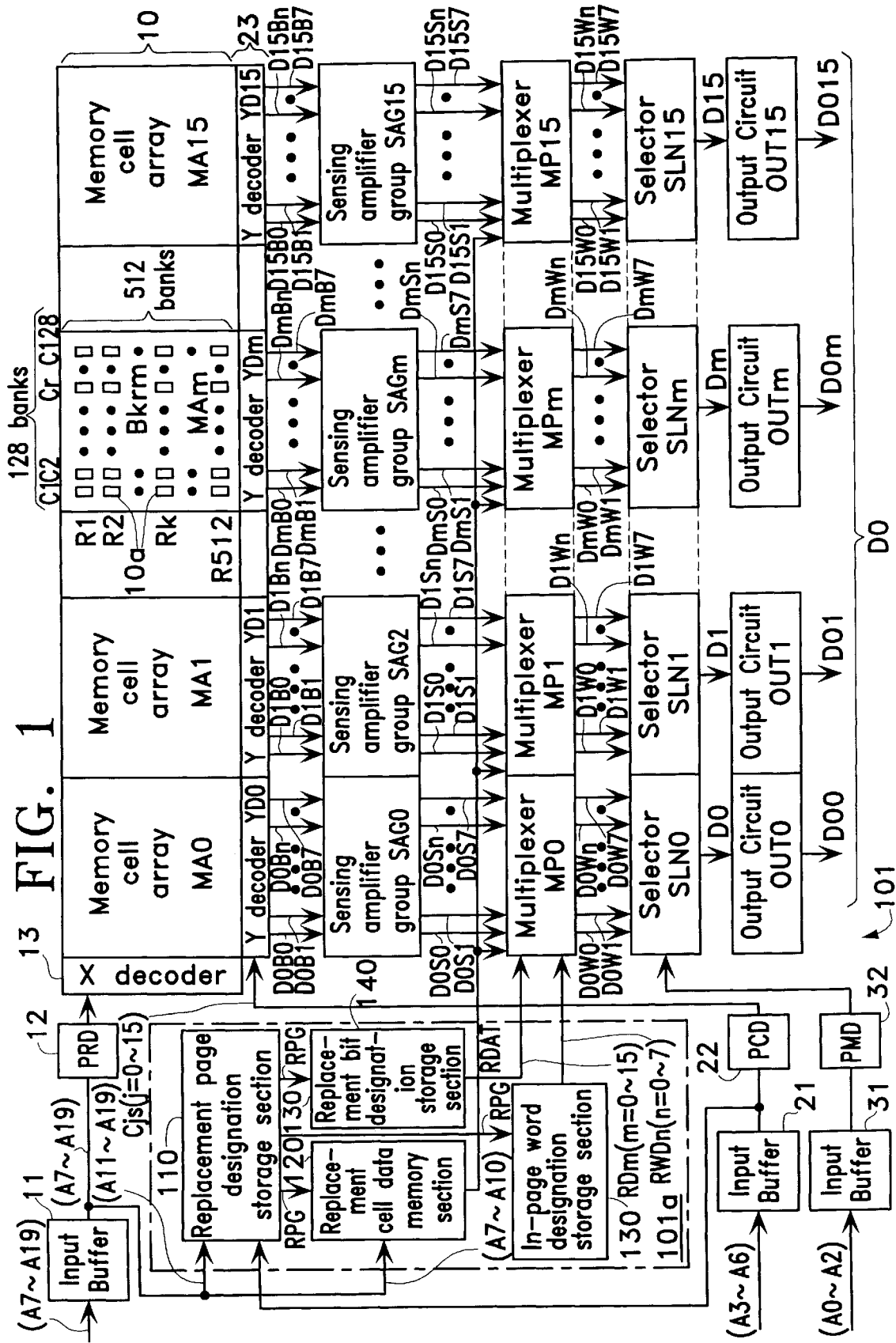
FIG. 1 is a block diagram illustrating an overall configuration of a mask ROM in a first example according to the present invention.
Figure 2:
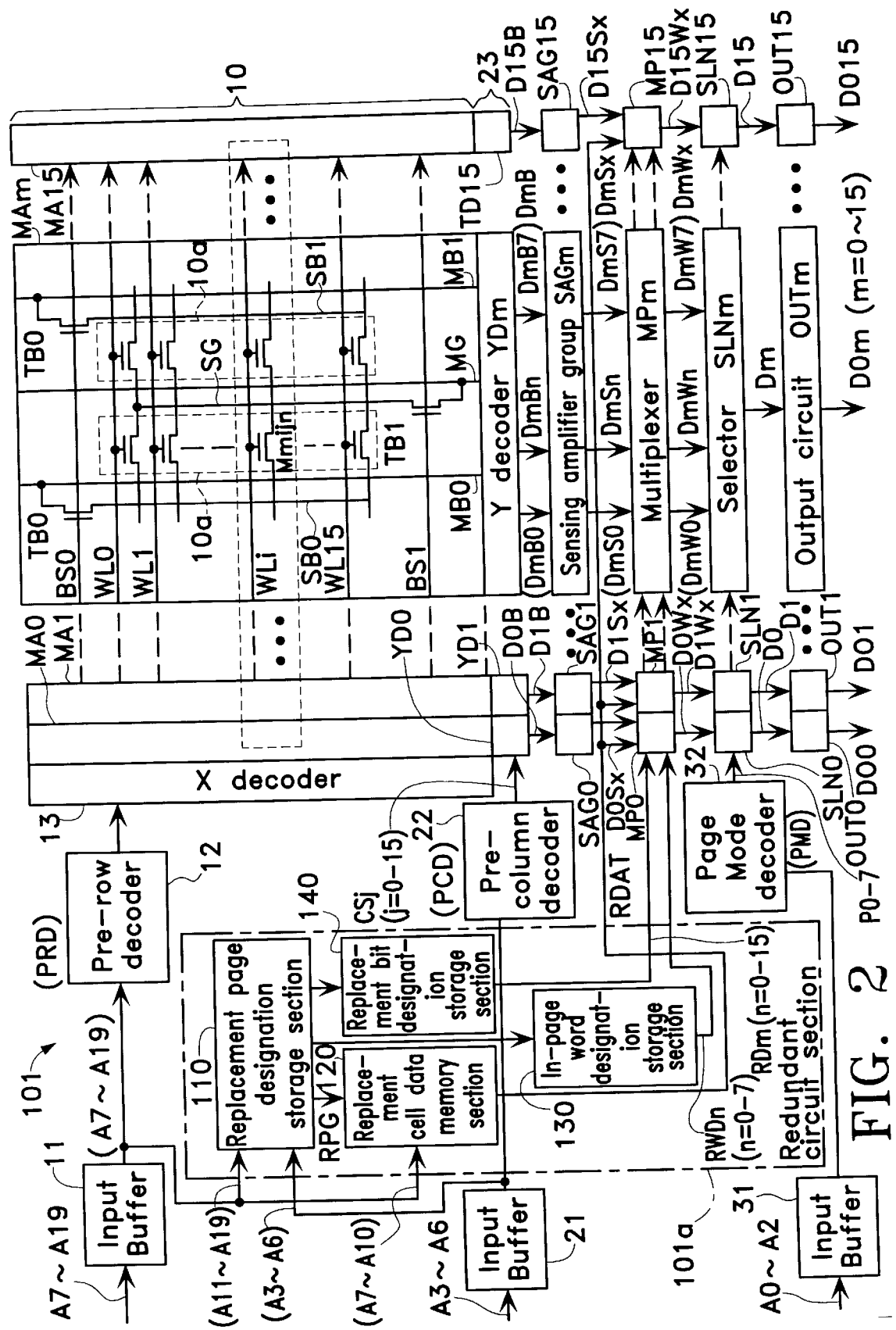
FIG. 2 is a block diagram illustrating a detailed configuration of a memory cell array in a main memory section of the mask ROM shown in FIG. 1.

FIG. 1 is a block diagram of a mask ROM as a semiconductor device in a first example according to the present invention. FIG. 2 shows a detailed configuration of a memory cell array included in a main memory of the mask ROM.

As shown in FIG. 1, a mask ROM 101 operable in a page mode adopting a redundancy compensation system receives an address signal (A0 through A19) and outputs 16-bit output data DO. The mask ROM 101 has a main memory section 10 in which memory cells Mmijn are arranged in a matrix as the mask ROM 200 operable in the conventional page mode. The memory cells Mmijn are divided into memory cell arrays MA0, MA1, ... MAm, ... MA15, each corresponding to one bit of the output data DO. The memory cell arrays MA0 through MA15 respectively output read cell data DO0, DO1, ... DOm, ... D015, each corresponding to one bit of the output data DO.

The mask ROM 101 includes a row selector and a column selector having the same configurations as in the conventional mask ROM 200. The row selector is provided for selecting memory cells of a row corresponding to the row address (A7 through A19) of the input address signal. The row selector includes an input buffer 11 for receiving the row address (A7 through A19), a pre-row decoder (PRD) 12 connected to an output of the input buffer 11, and an X decoder 13 for selecting a row in the memory cell arrays based on the output from the pre-row decoder 12. The column selector is provided for selecting memory cells of a plurality of columns corresponding to the column address (A3 through A6) of the input address signal. The column selector includes an input buffer 21 for receiving the column address (A3 through A6), a pre-column decoder (PCD) 22 connected to an output of the input buffer 21, and a Y decoder section 23 for selecting a plurality of columns in the main memory section 10 (memory cell arrays MA0 through MA15) based on the output from the pre-column decoder 22.

The Y decoder section 23 includes a plurality of Y decoders YD0, YD1, ... YDm, ... YD15 respectively corresponding to the memory cell arrays MA0 through MA15. Each of the Y decoders YD0 through YD15 outputs read cell data DmB0, DmB1, ... DmBn, ... DmB7 (m=0 through 15) from the memory cells Mmij0, Mmij1, ... Mmijn, ... Mmij7 of a prescribed row of the plurality of columns simultaneously selected from each of the memory cell arrays MA0 through MA15. The read cell data DmB0, DmB1, ... DmBn, ... DmB7 is output as, for example, the page data PD(h) of the page P(h) at address h.

As in the conventional mask ROM 200, the Y decoders YD0 through YD15 are respectively connected to sensing amplifier groups SAG0, SAG1, ... SAGm, ... SAG15 for sensing read cell data D0Bn through D15Bn (n: an integer from 0 through 7) from the memory cell arrays MA0 through MA15. The sensing amplifier groups SAG0 through SAG15 each include a plurality of (eight in this example) sensing amplifiers.

As can be appreciated from the above, in the mask ROM 101 in the first example, the main memory section 10, the row selection device, the column selection device, and the sensing amplifier groups SAG0 through SAG15 have the same specific configurations as in the conventional mask ROM 200.

Next, the memory cell array MAm and the Y decoder YDm will be described with reference to FIG. 2.

The memory cell array MAm is divided into a plurality of bank areas 10a. The bank areas 10a are arranged in a matrix of 512 (vertical)×128 (horizontal). In each bank area 10a, 16 memory cells are arranged vertically. Rows of the plurality of bank areas 10a arranged horizontally (hereinafter, referred to as "bank rows") R1, R2, ... Rk, ... R512 are each provided with 16 word lines WL0 through WL15. Each word line WLi (i: an integer of 0 through 15) is connected to gates of transistors (memory transistors) included in the memory cells Mmijn (i: an integer of 0 through 15) in the corresponding bank area 10a.

Between each two bank areas 10a adjacent to each other horizontally, a sub ground line SG formed of a diffusion layer is provided common to both of the bank areas 10a. On the other side of each bank area 10a, sub bit lines SB0 and SB1 formed of a diffusion layer are provided in correspondence with the respective bank area 10a. A source and a drain of each transistor (memory transistor) Mmijn in the corresponding bank areas 10a are connected to the sub bit lines SB0 and SB1 and the sub ground line SG.

Main bit lines MB0 and MB1 and a main ground line MG formed of a metal layer are provided in correspondence with bank columns Cr. The bank columns Cr each include a plurality of bank areas 10a arranged vertically. The sub bit lines SB0 and SB1 provided for the bank areas 10a in the corresponding bank columns are connected to the main bit lines MB0 and MB1 via a bank selection transistor TB0. The sub ground line provided for the bank areas 10a in the corresponding bank columns is connected to the main ground line MG via a bank selection transistor TB1.

To gates of the bank selection transistors TB0 and TB1, bank selection lines BS0 and BS1 are respectively connected. The bank selection lines BS0 and BS1 and the word lines WL0 through W015 are driven by the X decoder 13.

Figure 14:
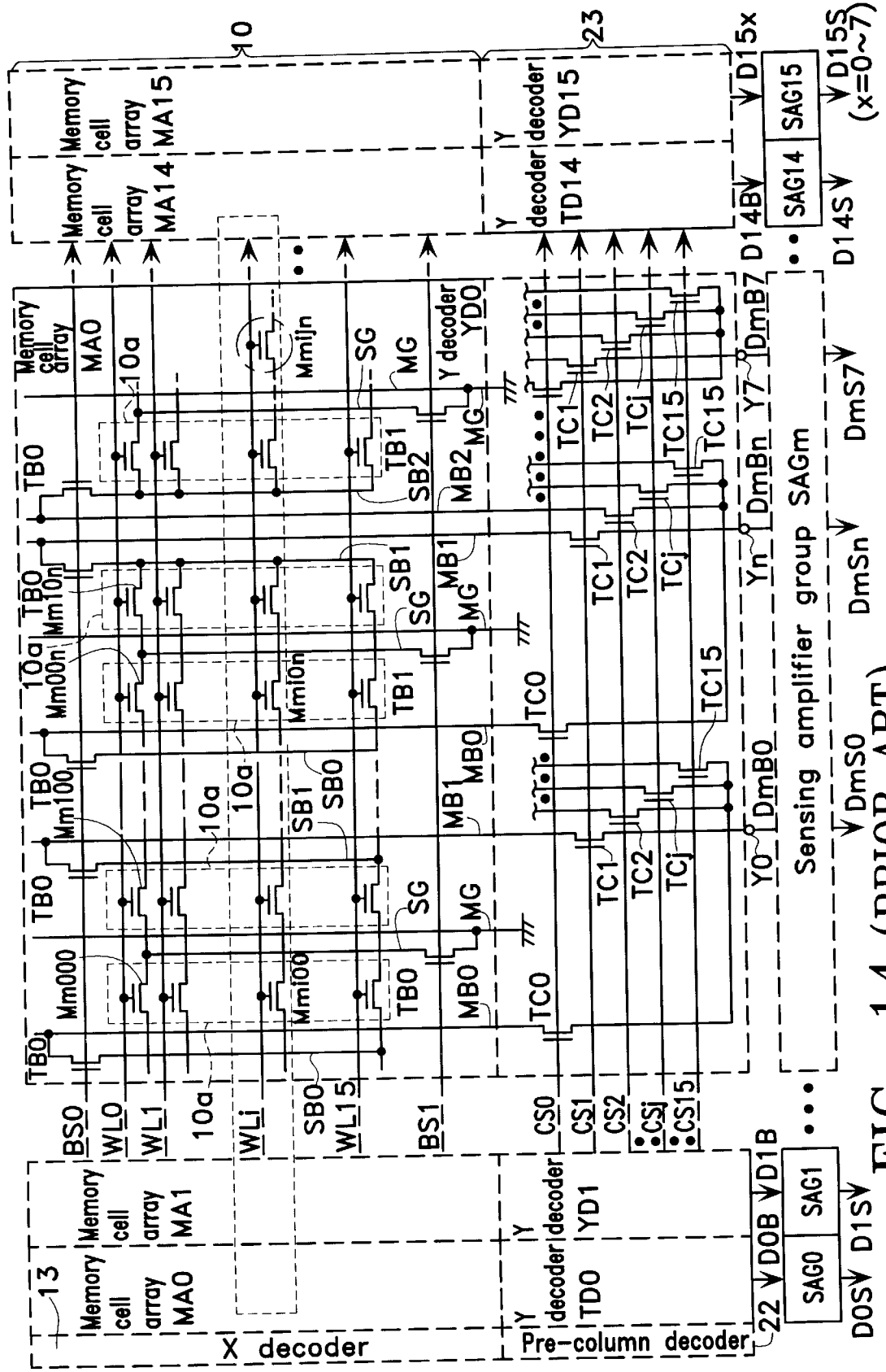
FIG. 14 is a view illustrating a detailed configuration of a Y decoder included in a Y decoder section together with the memory cell array of the conventional mask ROM shown in FIG. 12.
Figure 15:
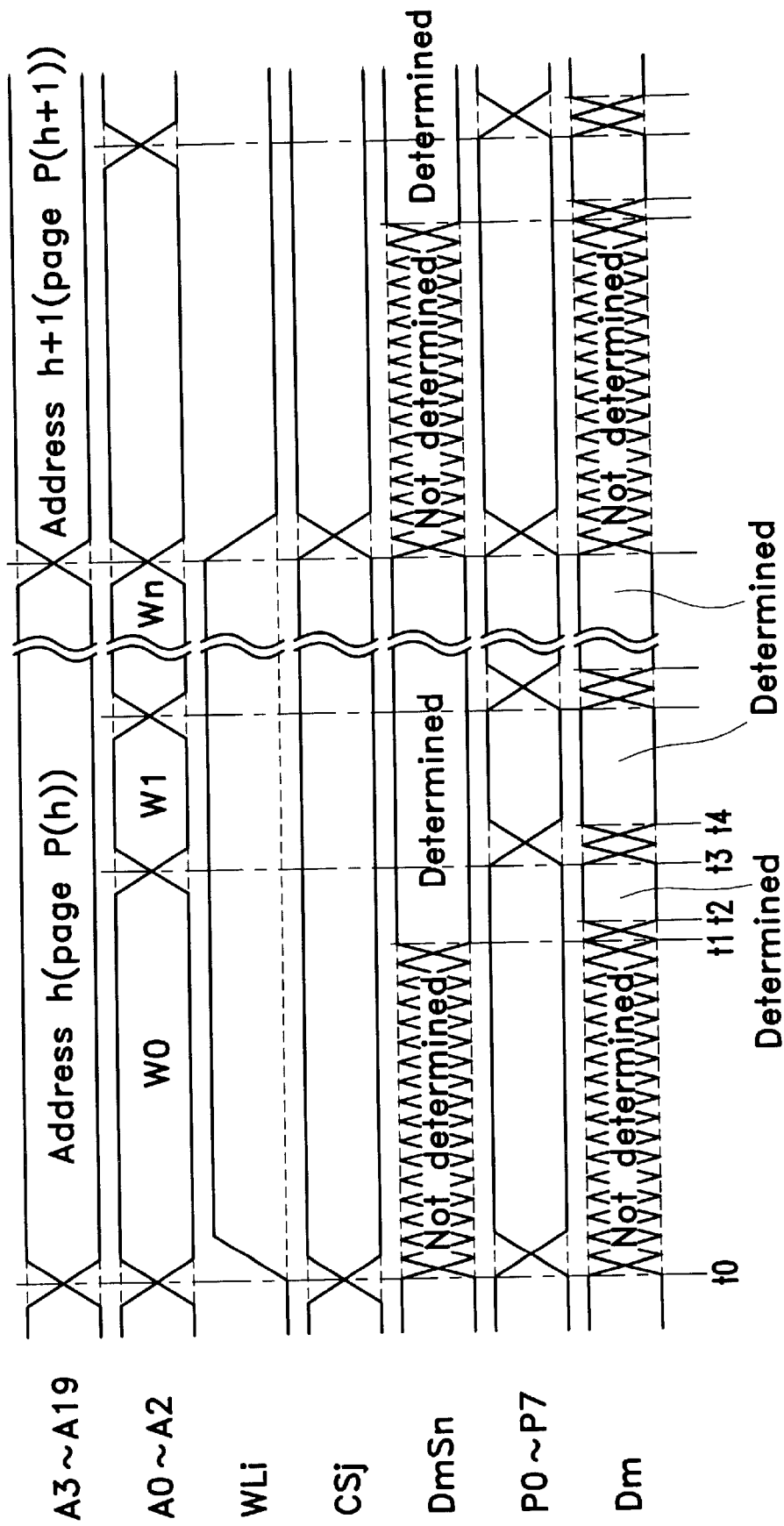
FIG. 15 is a timing diagram illustrating an access operation of the conventional mask ROM shown in FIG. 12 in a page mode.
Figure 16:
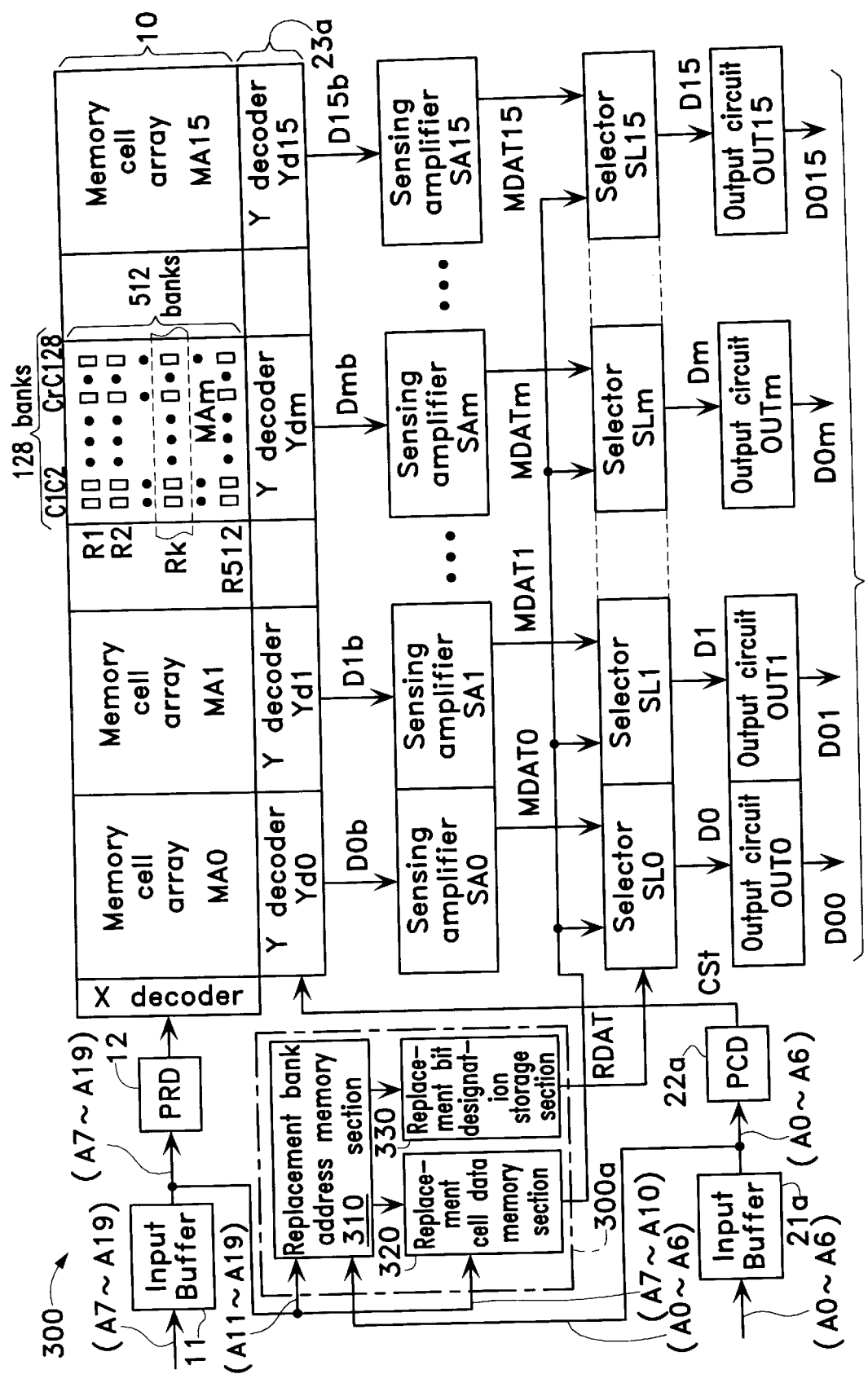
FIG. 16 is a block diagram illustrating an overall configuration of a conventional mask ROM adopting a redundancy compensation system.
Figure 17:
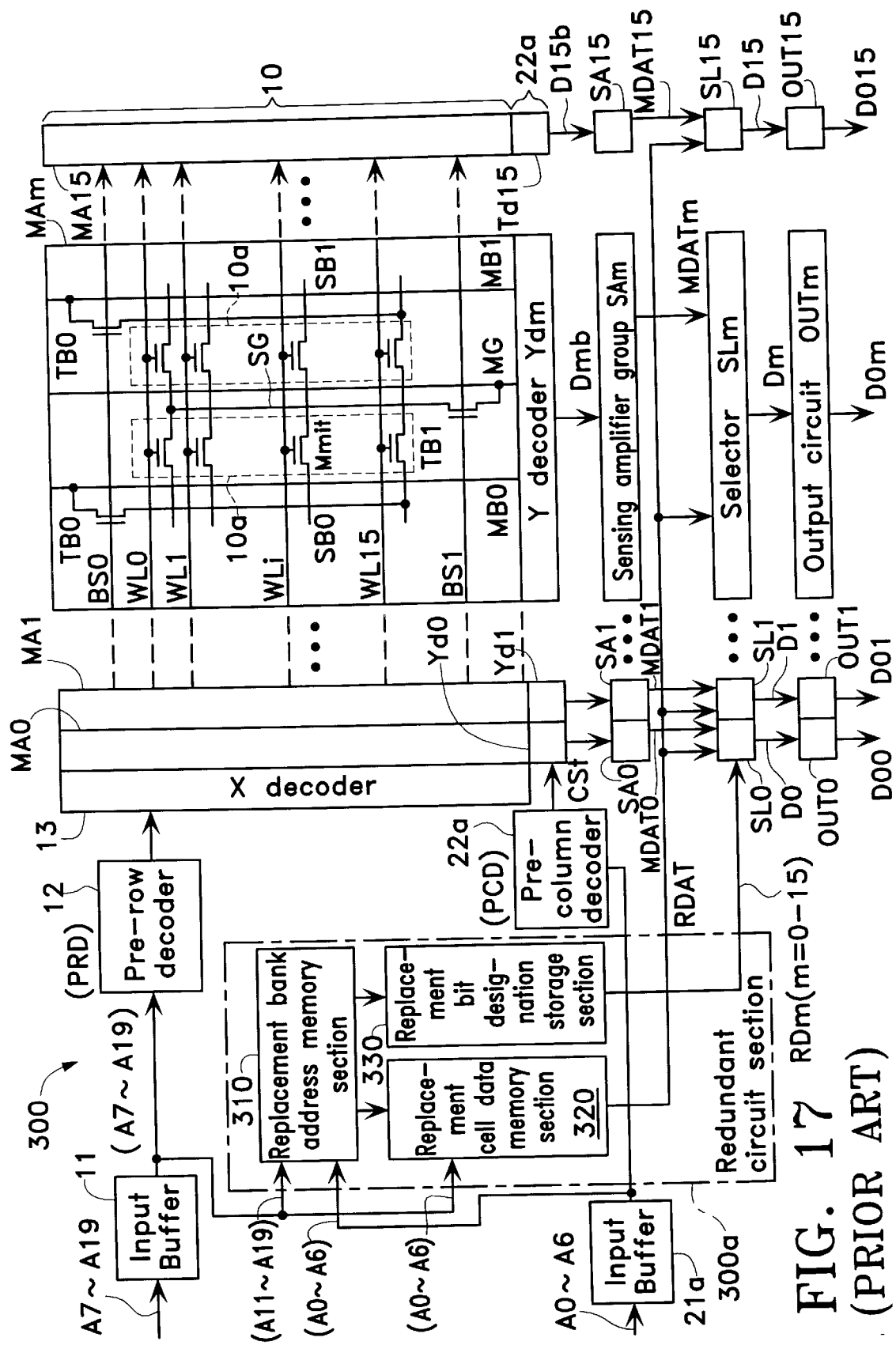
FIG. 17 is a block diagram illustrating a detailed configuration of a memory cell array in a main memory section of the conventional mask ROM shown in FIG. 16.

As shown in FIG. 14, the main bit lines MB respectively corresponding to bank columns are divided into groups. Each group includes 16 adjacent main bit lines MB corresponding to 16 adjacent bank columns. The first through 16th bit lines MBj (j: an integer of 0 through 15) of each group are connected to output terminals Yj (j: an integer of 0 through 15) of the Y decoder YDm (the output terminals Yj corresponds to the group) via column selection transistors TCj (j: an integer of 0 through 15) of the Y decoder YDm. To gates of the column selection transistors TC0 through TC15, column selection lines CS0 through CS15 are respectively connected. The column selection lines CS0 through CS15 are driven by the pre-column decoder 22.

According to the above-described configuration, when prescribed bank selection lines BS0 and BS1 and a prescribed word line WLi are selected by the X decoder 13 based on the row address (A7 through A19), a prescribed bank row Rk is selected, and also the memory cells in a prescribed row in each of the bank areas 10a belonging to the selected bank row Rk are selected. Then, when a prescribed column selection line CSj is selected by the pre-column decoder 22 based on the column address (A3 through A6), a prescribed bit line MBj in each group is selected. In this manner, based on the row address (A7 through A19) and the column address (A3 through A6), data in the memory cells Mmij0 through Mmij7 in the memory cell array MAm is output as one-page data, namely, read cell data DmB0 through DmB7, from the Y decoder YDm to the sensing amplifier group SAGm.

In the above description, the detailed configurations of the memory cell array MAm and the Y decoder YDm corresponding to the memory cell array MAm are explained. The other memory cell arrays and the other Y decoders corresponding thereto have the same configurations as those of the memory cell array MAm and the Y decoder YDm.

The mask ROM 101 in the first example includes a redundant circuit section (redundant memory section) 101a for compensating for data in a defective memory cell. The redundant circuit section 101a stores replacement cell data, treating each bank area 10a as a unit as in the conventional mask ROM 300.

The redundant circuit section 101a includes a replacement page designation storage section 110, a replacement cell data memory section 120, an in-page word designation storage section 130, and a replacement bit designation storage section 140. The replacement page designation storage section 110 stores an address of the page corresponding to the bank area 10a including a defective memory cell (hereinafter, referred to also as the "replacement target page") as a replacement page address; and when the input address and the replacement page address match each other, outputs a page designation address which designates the replacement target page. The replacement cell data memory section 120 stores replacement cell data corresponding to all the memory cells in the bank area 10a to be replaced including the defective memory cell. The in-page word designation storage section 130 stores an in-page word designation address which designates the replacement target word (word to be replaced) among the cell data (words) included in the page data of the replacement target page. The replacement bit designation storage section 140 stores replacement bit designation data which designates the bit m to be replaced among sense cell data DmSx (DmS0 through DmS7; m=0 through 15) from the plurality of sensing amplifier groups SAGm (m=0 through 15) respectively corresponding to each bit of the access data. The detailed configurations of the sections 110, 120, 130 and 140 are respectively shown in FIGS. 4, 5, 6 and 7 and will be described below.

The mask ROM 101 in the first example includes multiplexers MP0, MP1, . . . MPm, . . . MP15 respectively corresponding to the sensing amplifier groups SAG0, SAG1, . . . SAGm, . . . SAG15 for each bit. The multiplexers MP0 through MP15 receive sense cell data D0Sn through D15Sn (n: an integer from 0 through 7) from the sensing amplifier groups SAG0 through SAG15 and the replacement cell data RDAT from the memory section 120 of the redundant circuit section 101a. The multiplexers MP0 through MP15 are structured so as to replace the replacement target word in the data in the replacement target page with the replacement cell data RDAT, based on the in-page word designation address RWDn and the replacement bit designation data RDm from the storage sections 130 and 140 in the redundant circuit section 101a.

FIG. 3A shows a specific circuit configuration of the above-described multiplexer. As shown in FIG. 3A, the multiplexer MPm, for example, includes a plurality of replacement circuits MPXn (n: an integer from 0 through 7) for replacing the sense cell data DmSn (n: an integer from 0 through 7) from the sensing amplifiers SmGm with the replacement cell data RDAT from the redundant circuit section 101a.

As shown in FIG. 3B, the replacement circuit MPXn includes first and second n-type MOS transistors 151a and 152a connected in series between an input node 150a and an output node 150c of the replacement cell data RDAT, and also include first and second p-type MOS transistors 151b and 152b connected in parallel between an input node 150b and the output node 150c of the sense cell data DmSn. A replacement word selection line RWDn is connected to gates of the n-type MOS transistor 151a and the p-type MOS transistor 151b, and a replacement bit selection line RDn is connected to gates of the n-type MOS transistor 152a and the p-type MOS transistor 152b. As shown in FIG. 3C, it is selected whether the sense cell data DmSn is output as it is or output after replacement with the replacement cell data RDAT, based on the signal level of the selection lines RWDn and RDn. In FIG. 3C, the symbol "DmWn" represents the output from the replacement circuit MPXn of the :Multiplexer MPm. Symbols "L" and "H" respectively represent that the signal level of the selection lines RWDn and RDn is low and high. Symbol "X" represents that the signal level of the selection lines RWDn and RDn can be either low or high.

The mask ROM 101 in the first example further includes selectors SLN0 through SLN15 for selecting the outputs D0Wn through D15Wn (n is an integer from 0 through 7) from the multiplexers MP0 through MP15 corresponding to each bit. To the selectors SLN0 through SLN15, corresponding output circuits OUT0 through OUT15are connected. The output circuits OUT0 through OUT15perform signal processing, such as amplification, of cell data D0 through D15 selected by the selectors SL0 through SL15, and output the resultant signals as output cell data DO0 through DO15.

Hereinafter, specific circuit configurations of the sections 110, 120, 130 and 140 of the redundant circuit section 101a will be described.

Figure 4:
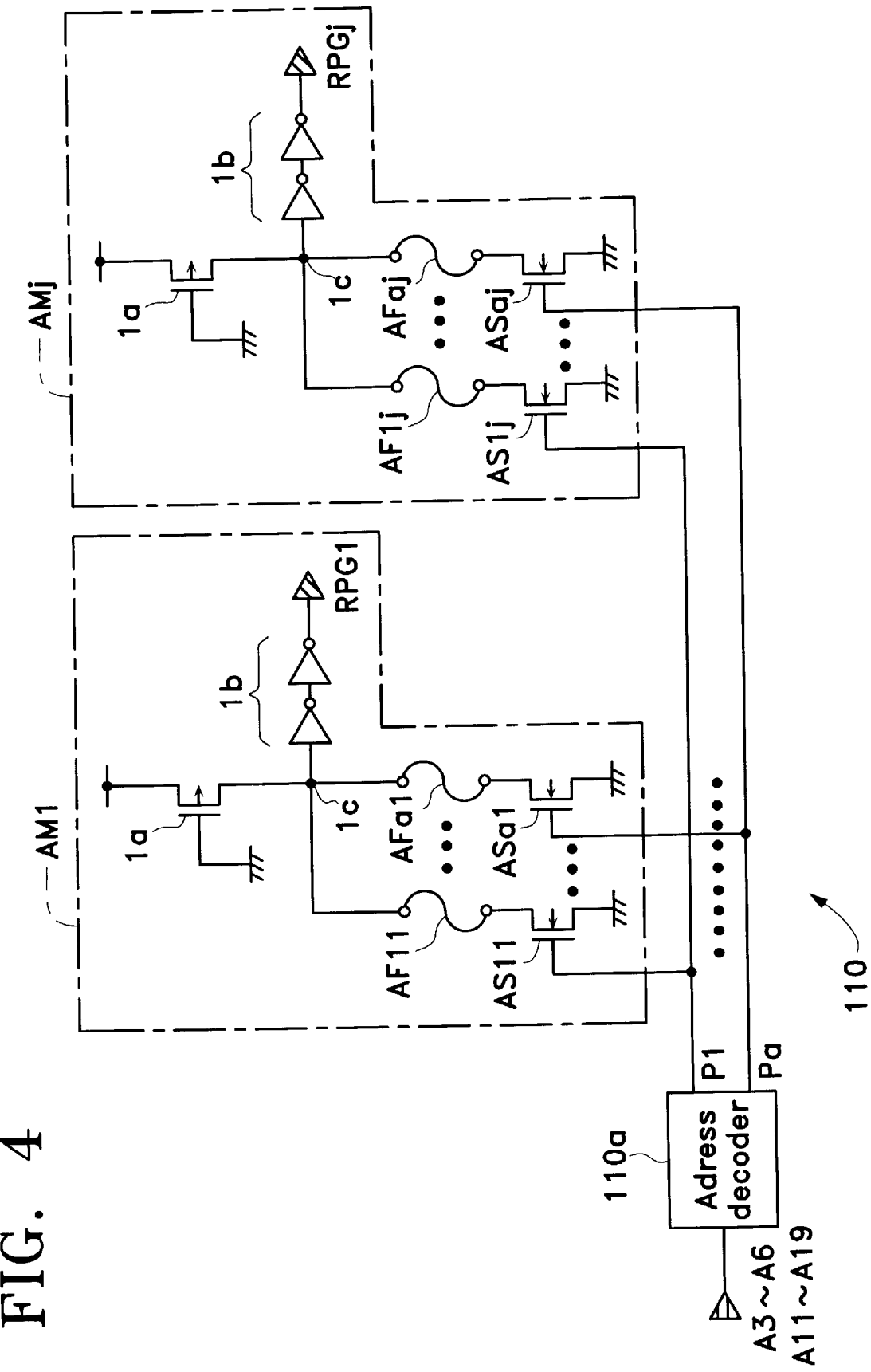
FIG. 4 is a circuit diagram illustrating a specific configuration of a replacement page designation storage section in a redundant circuit section of the mask ROM shown in FIG. 1.

FIG. 4 shows a specific circuit configuration of the replacement page designation storage section 110. The replacement page designation storage section 110 includes an address decoder 110a for converting page designation parts of the input address signal (A3 through A6, A11 through A19) into 26 page determination signals P1, P2, . . . Pa (a=26) corresponding to the page designation parts (A3 through A6, A11 through A19) and their conversion signals (/A3 through /A6, /A11 through /A19), and also includes a plurality of page memory determination circuits AM1 through AMj for determining whether or not the stored replacement target page address matches the page designation parts in the input address signal. The number j of the page memory determination circuits is determined based on the statistical ratio of generation of defective memory cells. In the case where such a generation ratio is relatively small, one page memory determination circuit can be sufficient.

For example, the page memory determination circuit AMj includes a p-type driving transistor 1a connected between an inner signal node 1c and the power supply, a plurality of n-type switching transistors AS1j, . . . ASaj (a=26) each having one grounded end, and a plurality of fuse elements AF1j, . . . AFaj (a=26) respectively connected between the other ends of the n-type switching transistors AS1j through ASaj and the inner signal node 1c.

The p-type driving transistor 1a has a gate thereof grounded and thus is always conductive. To the gates of the n-type switching transistors AS1j through ASaj, the page determination signals P1 through Pa are to be applied.

To the inner signal node 1c in the page memory determination circuit AMj, an output buffer 1b including two-stage inverter circuits connected in series is connected. A designation address as a result of the page determination is output to a replacement page selection line RPGj via the output buffer 1b.

In the above description, the configuration of the page memory determination circuit AMj is explained in detail. The other page memory determination circuits AM1, . . . have the same configuration as shown in FIG. 4.

Hereinafter, a method for setting a replacement target page address by the replacement page designation storage section 110 will be briefly described.

Herein, for example, it is presumed that the page P(h) at address h is the replacement target page. Assuming that data to be stored in the page memory determination circuit AMj (j=1) as the replacement target page address is A3(P1)=1, /A3(P2)=0, A4(P3)=0, /A4(P4)=1, . . . , A11(P9)=0, /A11 (P10)=1, . . . , A19(P25)=0, /A19(P26)=1, the fuse elements AF1j through AFaj in the page memory determination circuit AMj are set so that AF1j is cut, AF2j is not cut, AF3j is not cut, AF4j is cut, . . . , AF9j is not cut, AF10j is cut, . . . , AF25j is not cut, and AF26j is cut. The replacement target addresses (A3 through A6, A11 through A19) are common in the pages overlapping the bank area of the page P(h). The fuse elements are cut by melting such as by radiation from laser light.

In the case where the other page P(h') or P(h") is the replacement target page, the replacement target page address is set in another page memory determination circuit AMj(j=2 or 3).

In the case where the replacement target page address is set in the page memory determination circuit AMj as described above, when the outputs P1 through Pa from the address decoder 110a match the replacement target page address stored in the corresponding page memory determination circuit AMj, all the switching transistors AS1j through ASaj become non-conductive and the replacement page selection line RPGj in the page memory determination circuit AMj becomes active. Thus, the page designation address which designates the page P(h) is output from the page memory determination circuit AMj.

When the outputs P1 through Pa from the address decoder 110a do not match the replacement target page address stored in the corresponding page memory determination circuit AMj, at least one of the switching transistors AS1j through ASaj becomes conductive and the replacement page selection line RPGj in the page memory determination circuit AMj becomes inactive. Thus, the selection of the page P(h) is not performed. When none of the outputs P1 through Pa from the address decoder 110a matches the replacement target page address stored in the corresponding page memory determination circuit AMj, designation of the replacement target page is not performed. Since the page data read from the sensing amplifier group does not include any defective word, data replacement is not performed.

Figure 5:
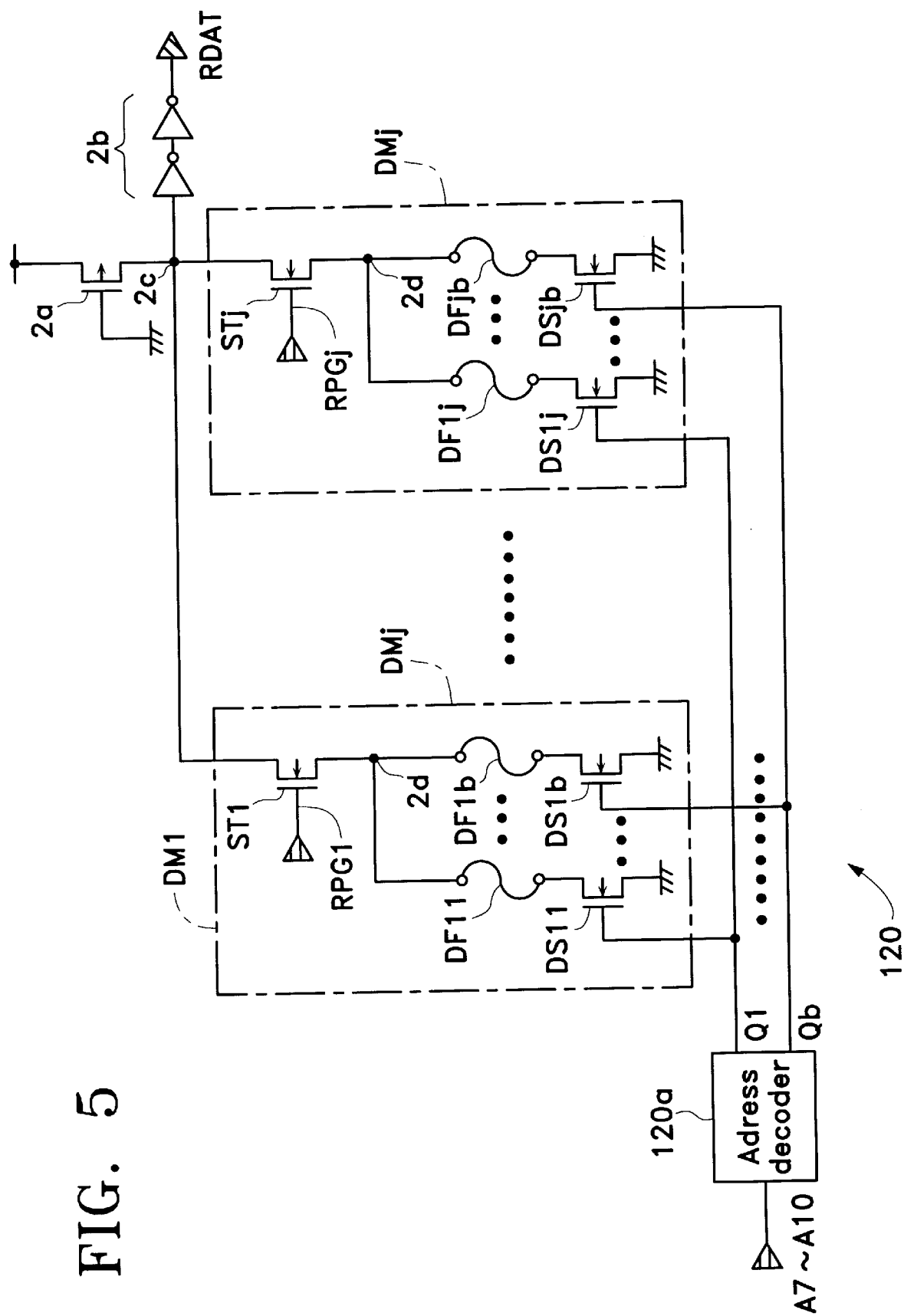
FIG. 5 is a circuit diagram illustrating a specific configuration of a replacement cell data memory section in the redundant circuit section of the mask ROM shown in FIG. 1.

Next, a specific configuration of the replacement cell data memory section 120 will be described with reference to FIG. 5. As shown in FIG. 5, the replacement cell data memory section 120 includes an address decoder 120a for converting parts in the input address signal (A7 through A10) designating a vertical position in the bank area, i.e., the word line Wi in the bank area into 16 in-bank position designation signals Q1, . . . Qb (b=16), and also includes a plurality of data memory circuits DM1, . . . , DMj for outputting the stored replacement cell data to the output node 2c based on the output from the address decoder 120a and the page designation address from the replacement page designation storage section 110. The number j of the data memory circuits DMj is equal to the number of the page memory determination circuits AMj.

A p-type driving transistor 2a is connected between the output node 2c and the power supply. The p-type driving transistor 2a has a gate thereof grounded and thus is always conductive. To the output node 2c, an output buffer 2b including two-stage inverter circuits connected in series is connected. The data in the data memory circuit DMj is output as the replacement cell data RDAT via the output buffer 2b.

For example, the data memory circuit DMj includes a page designation n-type switching transistor STj connected between the output node 2c and an inner signal node 2d, a plurality of word designation n-type switching transistors DSj1, . . . , DSjb (b=16) each having one grounded end, and a plurality of fuse elements DFj1, . . . DFjb (b=26) respectively connected between the other ends of the n-type switching transistors DSj1 through DSjb and the inner signal node 2d. To a gate of the page designation switching transistor STj, the page designation address RPGj is to be applied via a replacement page selection line RPGj in the page memory determination circuit AMj. To gates of the switching transistors DSj1 through DSjb, the in-bank position designation signals Q1 through Qb from the address decoder 120a are to be applied.

In the above description, the configuration of the data memory circuit DMj is explained in detail. The other data memory circuits DM1, . . . have the same configuration as shown in FIG. 5.

Hereinafter, a method for setting replacement cell data by the replacement cell data memory section 120 will be briefly described.

For example, in the case where a prescribed memory cell in the page P(h) has a defect, the bank area having the defective memory cell in the page P(h) and the data to be stored in all the memory cells in that bank area are stored in the data memory circuit DMj (j=1) in the replacement cell data memory section 120 respectively as the replacement target bank area and the replacement cell data.

In the case where, for example, the cell data in the memory cells corresponding to the in-bank position, i.e., the word lines WL0, WL1, . . . , WL15 is "1", "0", . . . , "0" in the replacement target bank area, the fuse elements DFj1 through DFj16 corresponding to the word lines WL0 through WL15 are set so that DFj1 is cut, DFj2 is not cut, and DFj16 is not cut. In this case also, the fuse elements are cut by melting such as by radiation from laser light.

As described above, by storing the replacement cell data by the unit of one bank area, replacement of the word at a prescribed position in each of the pages overlapping a bank area of the page P(h), i.e., in the pages in which the addresses (A3 through A6, A11 through A19) are common can be performed using the cell data in one data memory circuit DMj.

In other words, even if a certain page is different from the page P(h), as long as the page includes a memory cell in a bank area overlapping a row of the memory cell included in the page P(h), the cell data in the same data memory circuit DMj used for the page P(h) can be used as replacement cell data for such a page. The bank area overlapping a row of the memory cell included in the page will be referred to the "bank area overlapping the page".

In the case where page P(h') or P(h") not overlapping a bank area of the page P(h) includes a defective memory cell, the bank area overlapping the page P(h') or P(h") and the data to be stored in all the memory cells in that bank area are stored in the data memory circuit DMj (j=2 or 3) respectively as the replacement target bank area and the replacement cell data. When 16 data memory circuits DMj (j=1 through 16) are provided, a defective word in the page data can be compensated for with respect to the pages overlapping 16 bank areas at the maximum.

When the outputs P1 through Pa from the address decoder 110a match the replacement target page address stored in the corresponding page memory determination circuit AMj and the data memory circuit DMj is designated by the page designation address from the replacement page selection line RPGj, the switching transistors DSj1 through DSjb become conductive in accordance with an in-bank row designation address (A7 through A10). Thus, output buffer 2b outputs the replacement cell data RDAT, stored in the data memory circuit DMj, corresponding to the memory cell overlapping the replacement target page in the replacement target bank area.

Figure 6:
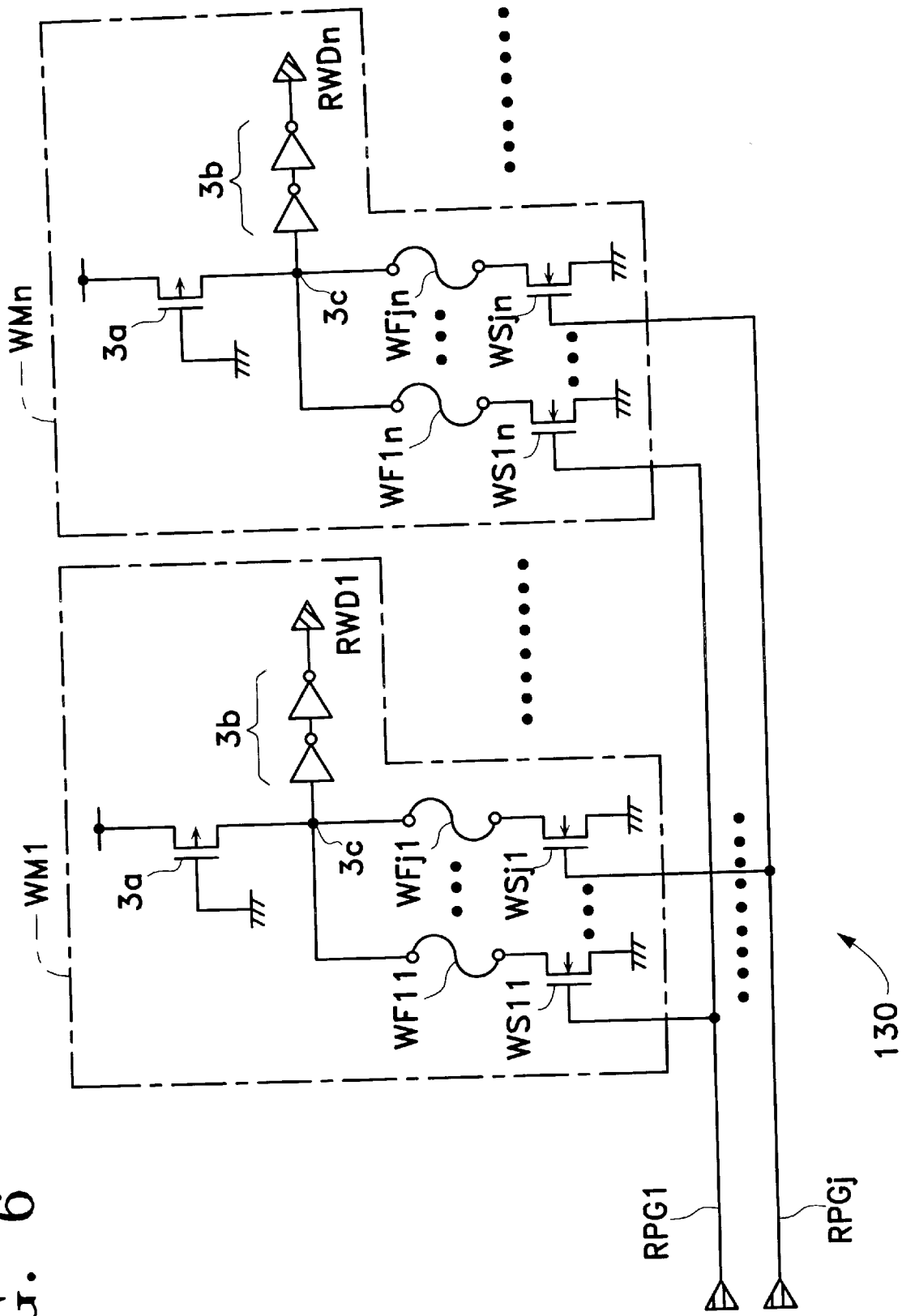
FIG. 6 is a circuit diagram illustrating a specific configuration of an in-page word designation storage section in the redundant circuit section of the mask ROM shown in FIG. 1.

With reference to FIG. 6, a specific configuration of the in-page word designation storage section 130 will be described. As shown in FIG. 6, the in-page word designation storage section 130 includes a plurality of word designation memory circuits WM1, . . . , WMn (n=8) for outputting data which designates the stored in-page word designation address, i.e., a defective word in each piece of replacement target page data, based on the page designation address supplied from the replacement page designation storage section 110 via replacement page selection lines RPG1 through RPGj.

For example, the word designation memory circuit WMn includes a p-type driving transistor 3a connected between an inner signal node 3c and the power supply, a plurality of n-type switching transistors WS1n, WSjn (n=8, j: equal to the number of the page memory determination circuits AMj) each having one grounded end, and a plurality of fuse elements WF1n, . . . WFjn (n=8, j: equal to the number of the page memory determination circuits AMj) respectively connected between the other ends of the n-type switching transistors WS1n through WSjn and the inner signal node 3c.

The p-type driving transistor 3a has a gate thereof grounded and thus is always conductive. Gates of the n-type switching transistors WS1n through WSjn are connected to the replacement page selection lines RPG1 through RPGj.

To the inner signal node 3c in the word designation memory circuit WMn, an output buffer 3b including two-stage inverter circuits connected in series is connected. The in-page word designation address is output to the replacement word selection line RWDn via the output buffer 3b.

In the above description, the configuration of the word designation memory circuit WMn is explained in detail. The other word designation memory circuits WM1, . . . have the same configuration as shown in FIG. 6.

Hereinafter, a method for setting in-page word designation address by the in-page word designation storage section 130 will be briefly described.

For example, in the case where a first word in the page data corresponding to the replacement target page address stored in the page memory determination circuit AMj is defective, the fuse element WFj1 in the word designation memory circuit WM1 is cut. In the case where the "n"th word in the page data corresponding to the replacement target page address stored in the page memory determination circuit AM1 is defective, the fuse element WF1n in the word designation memory circuit WM1 is cut. In this case also, the fuse elements are cut by melting such as by radiation from laser light.

When the outputs P1 through Pa from the address decoder 110a match the replacement target page address stored in the corresponding page memory determination circuit AMj and the replacement page selection line RPGj becomes active, the corresponding switching transistors WSj1 through WSjn become conductive in each word designation memory circuits WM1 through WMn. The replacement word selection line RWD1 in the word designation memory circuit WM1 including the cut fuse element among the fuse elements WFj1 through WFjn corresponding to the switching transistors WSj1 through WSjn becomes active. (For example, in the case where the first word in the page data designated by the replacement page selection line RPGj is defective, the fuse element WFj1 is cut.) Thus, data replacement of the first word in the page data designated by the replacement page selection line RPGj becomes possible.

Figure 7:
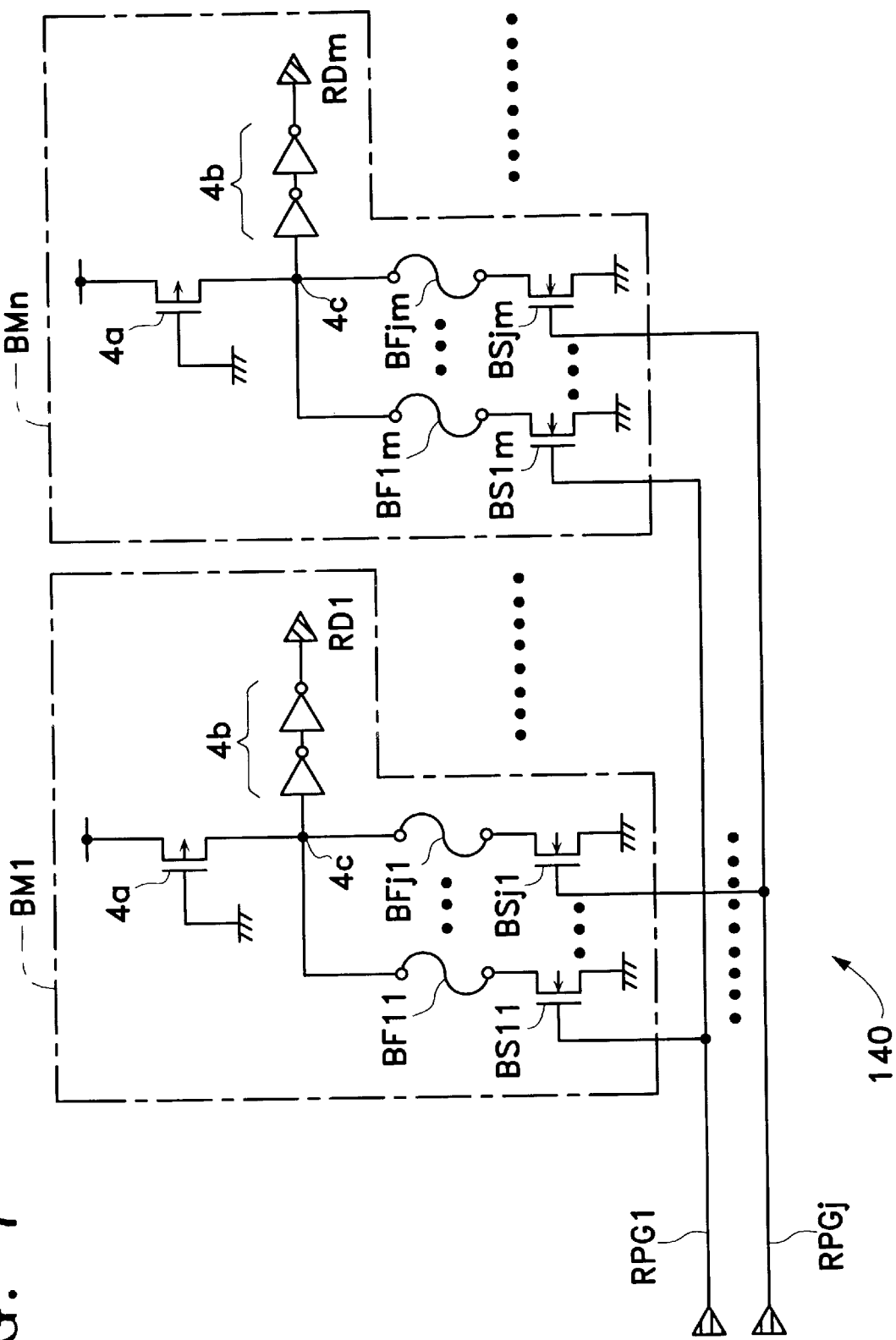
FIG. 7 is a circuit diagram illustrating a specific configuration of a replacement bit designation storage section in the redundant circuit section of the mask ROM shown in FIG. 1.

With reference to FIG. 7, a specific configuration of the replacement bit designation storage section 140 will be described. As shown in FIG. 7, the replacement bit designation storage section 140 includes a plurality of replacement bit designation storage circuits BM1, . . . , BMm (m=16) for outputting the stored replacement bit designation bit, i.e., the data which designates the memory cell arrays MA0 through MA15 to be replaced, based on the page designation address from the replacement page selection lines RPG1 through RPGj in the replacement page designation storage section 110, to the respective replacement bit selection line.

For example, the replacement bit designation storage circuit BMm includes a p-type driving transistor 4a connected between an inner signal node 4c and the power supply, a plurality of n-type switching transistors BS1m, . . . , BSjm (m=16, j: equal to the number of the page memory determination circuits AMj) each having one grounded end, and a plurality of fuse elements BF1m, . . . BFjm (m=16, j: equal to the number of the page memory determination circuits AMj) respectively connected between the other ends of the n-type switching transistors BS1m through BSjm and the inner signal node 4c.

The p-type driving transistor 4a has a gate thereof grounded and thus is always conductive. To gates of the n-type switching transistors BS1m through BSjm, a page designation address is to be applied to the replacement page selection lines RPG1 through RPGj.

To the inner signal node 4c in the replacement bit designation storage circuit BMm, an output buffer 4b including two-stage inverter circuits connected in series is connected. The replacement bit designation data is output to the replacement bit selection line RDn via the output buffer 4b.

In the above description, the configuration of the replacement bit designation storage circuit BMm is explained in detail. The other replacement bit designation storage circuit BM1, . . . have the same configuration as shown in FIG. 7.

Hereinafter, a method for setting replacement bit designation data by the replacement bit designation storage section 140 will be briefly described.

For example, in the case where the replacement target page data corresponding to the replacement page address stored in the page memory determination circuit AMj corresponds to the first memory cell array MA0, the fuse element BFj1 in the replacement bit designation storage circuit BM1 is cut. In the case where the replacement target page data corresponding to the replacement page address stored in the page memory determination circuit AM1 corresponds to the "(m+1)th memory cell array MAm, the fuse element BF1m in the replacement bit designation storage circuit BMm is cut. In this case also, the fuse elements are cut by melting such as by radiation from laser light.

When the outputs P1 through Pa from the address decoder 110a match the replacement target page address stored in the corresponding page memory determination circuit AMj and the replacement page selection line RPGj becomes active ("high" level), the corresponding switching transistors BSj1 through BSjm become conductive in each replacement bit designation storage circuit BM1 through BMn. The replacement bit selection line RD1 in the replacement bit designation storage circuit BM1 including the cut fuse element among the fuse elements BFj1 through BFjm corresponding to the switching transistors BSj1 through BSjm becomes active. (For example, in the case where the replacement target page data designated by the replacement page selection line RPGj corresponds to the first memory cell array MA0, the fuse element BFj1 is cut.) Thus, data replacement in the memory cell array MA0 corresponding to the replacement target page data designated by the replacement page selection line RPGj becomes possible.

Hereinafter, the operation of the mask ROM 101 adopting the redundant circuit section 101a in the first example will be described.

In the case where a prescribed page in the prescribed memory cell array MAm has a defective memory cell, a replacement page address (corresponding to input address A3 through A6, A11 through A19) designating a replacement target page is stored in the replacement page designation storage section 110. An in-page word designation address which designates the defective word (data of the defective cell) in the replacement target page is stored in the in-page word designation storage section 130. Moreover, replacement bit designation data which indicates the bit of the data corresponding to the memory cell array MAm including the defective memory cell is stored in the replacement bit designation storage section 140. The data to be stored in each memory cell in the replacement target bank area including the defective memory cell is stored in the replacement cell data memory section 120 in accordance with the address (A7 through A10) corresponding to the position of the data in the bank area (position in the row direction).

Accordingly, in the mask ROM 101 in the first example, the replacement target bank area Bkrm (FIG. 1) including the defective memory cell in the prescribed memory cell array MAm is designated by the replacement page designation address and the in-page word designation address. To which memory cell among the memory cells MA0 through MA15 the replacement target bank area Bkrm belongs is designated by the replacement bit designation data.

Next, a read operation in the page mode and replacement of page data in the read operation will be described.

Figure 8:
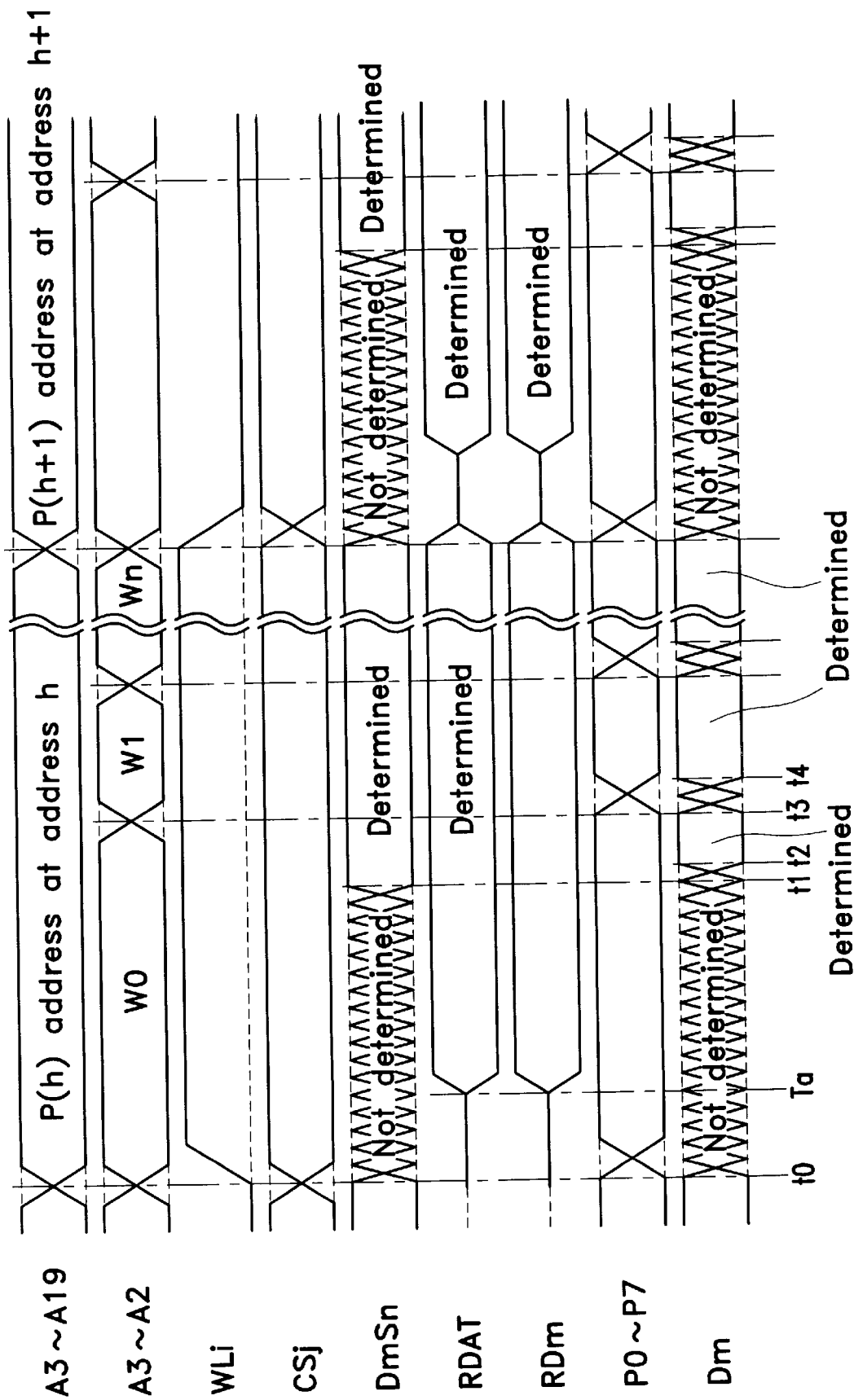
FIG. 8 is a timing diagram illustrating an access operation of the mask ROM shown in FIG. 1 in a page mode.
Figure 9:
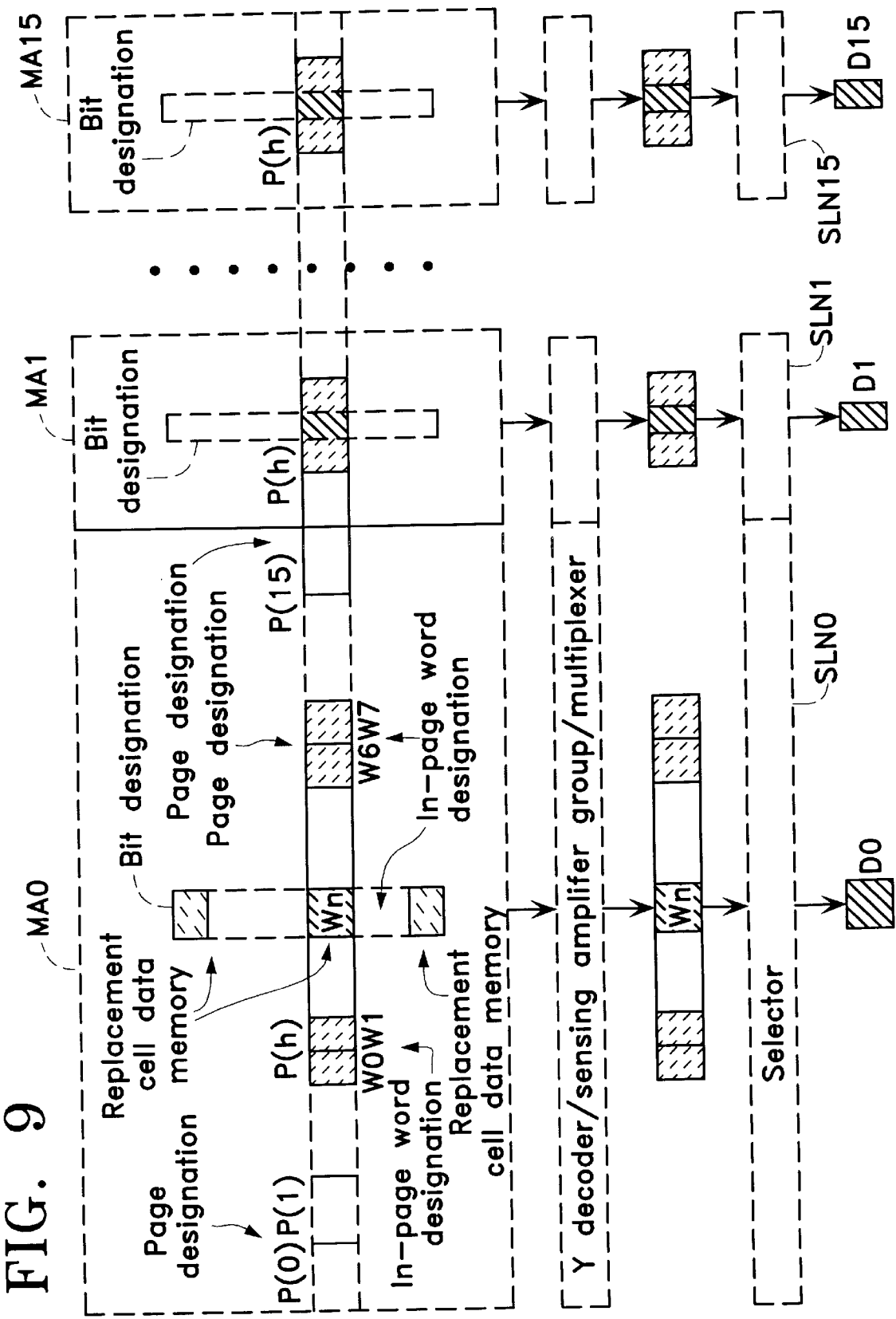
FIG. 9 is a diagram illustrating a data replacement operation of the mask ROM shown in FIG. 1, specifically, in-page word designation and bit designation.

FIG. 8 is a timing diagram illustrating an example of the read operation in the page mode. FIG. 9 shows a data replacement operation, specifically in-page word designation and bit designation performed by the mask ROM 101.

When input of an address (A3 through A19) of the input address signal is determined at time t0, the page data PD(h) at a prescribed page address (address h) is read into each sensing amplifier group SAG0 through SAG15 as the data D0Bn through D15Bn (n: an integer from 0 through 7). The data read from the memory cells in this case is performed in a usual random access mode as follows.

First, when the row address (A7 through A19) is determined, the bank selection lines BS0 and BS1 for selecting one of the bank rows Rk among the bank rows R1 through R512 of the bank areas 10a and one word line WLi among the word lines WL0 through WL15 in the selected bank row Rk are driven by the X decoder 13. At this point, the bank selection lines BS0 and BS1 and the word line WLi become active ("high" level).

When the column address (A3 through A6) is determined along with the determination of the row address (A7 through A19), one column line CSj among the column lines CS0 through CS15 is driven by the pre-column decoder 22, and the signal level of the one column line CSj becomes active ("high" level). The column selection transistor TCj (not shown) of the Y decoder 23 which receives a signal from the column selection line CSj becomes "ON".

Thus, the memory cells Mmij0, Mmij1, ... Mmij7 (m=0 through 15) included in a prescribed page among a plurality of memory cells Mmijn connected to the selected word line WLi are selected in each memory cell array, and the cell data in each memory cell is input to the sensing amplifier groups SAG0 through SAG15 as page data DmBx (DmB0, DmB1, ..., DmBn, ... DmB7; m=0 through 15) via the column selection transistors TCj.

Next, at time t1, sensing amplifier outputs DmSx (DmS0, DmS1, ... DmS7; m=0 through 15) from the sensing amplifier groups SAGm are determined. Thus, the read of the page data PD(h) at address h designated by the address signal (A3 through A19) to the multiplexer MPm (m=0 through 15) is completed.

During such a random access operation, namely, during the time period from the determination of the input address (t0) until the determination of the sense cell data DmSn (t1), the replacement cell data RDAT is read from the replacement cell data memory section 120 to each multiplexer MPm (time Ta) based on the information stored in the replacement page designation storage section 110, the in-page word designation storage section 130 and the replacement bit designation storage section 140. The defective word in the replacement target page data is replaced with the data read to the multiplexers MPm by the multiplexers MPm.

In the case where the page address (A3 through A6, A11 through A19) of the input address signal matches the replacement target page address stored in the page memory determination circuit AMj in the replacement page designation storage section 110, the replacement page selection line RPGj of the page memory determination circuit AMj becomes active. Thus, as shown in FIG. 9, the page P(h) is designated in each memory cell array MA0 through MA15. Then, the page designation address is output to the replacement cell data memory section 120, the in-page word designation storage section 130 and the replacement bit designation storage section 140 from the replacement page selection line RPGj.

Then, the replacement cell data RDAT is output to the multiplexers MPm (m=0 through 15) from the data memory circuit DMj of the replacement cell data memory section 120 based on the in-bank position designation parts (A7 through A10) of the determined input address. In the in-page word designation storage section 103, the replacement word selection line RWDn of the corresponding word designation memory circuit WMn becomes active. Thus, as shown in FIG. 9, the word Wn in the designated page P(h) is designated. In the replacement bit designation storage section 140, the replacement bit selection line RDn of the corresponding replacement bit designation storage circuit BMm becomes active. Thus, as shown in FIG. 9, the memory cell array MAm for the bit to be replaced is designated. As a result, the corresponding multiplexer MPm replaces the prescribed word Wn in the page data with the replacement cell data RDAT based on the signals from the replacement word selection line RWDn and the replacement bit selection line RDn.

At this point, in accordance with the page address signal (A0 through A2), only one of the output signals P0, P1, ..., P7 of the page mode decoder 32 becomes active ("high" level). Accordingly, one output DmWn among the outputs DmWn (DmW0 through DmW7) from the corresponding multiplexer MPm is selected by each selector SLNm (m=0 through 15). Thus, the first word W0 in the page data PD(h) at address h, i.e., data in the memory cell Mmij0 in the memory cell arrays MAm (m=0 through 15) respectively corresponding to each bit is output to the output terminal DOm of the output circuit OUTm (m=0 through 15) corresponding to each bit at time t2.

After that, when the page address signal (A0 through A2) starts changing at time t3, sense cell data DmSn (n=0 through 7) is sequentially selected by each selector SLNm. When the output signal (P0 through P7) from the page mode decoder 32 is determined at time t4, a second word W1 in the page data PD(h) at address h, i,e., data in the memory cell Mmij1 in the memory cell array MAm (m=0 through 15) corresponding to each data bit is output to the output terminal DOm of the output circuit OUTm corresponding to each bit.

After that, each time the page address (A0 through A2) changes and the sensing amplifier selecting signal (P0 through P7) from the page mode decoder 32 is determined, a third word W2 through an eighth word W7 in the page data PD(h) at address h are sequentially output to the output terminal DOm of each output circuit OUTm.

As described above, after the page data is determined by the random access and the first word of the page data is determined, when a prescribed time period has passed since the start of the change in the page address signal (A0 through A2), the mask ROM 101 goes into the page mode allowing the high-speed read. Thus, the data in the memory cell is output at a high speed.

Then, when the page address (A3 through A19) changes, page data PD(h+1) at address (h+1) is read to the sensing amplifier groups SAG0 through SAG15 again in the random access mode. In the case where the page address (A3 through A6, A11 through A19) of the input address matches the replacement target page address stored in the replacement page designation storage section 110, data replacement of the page data is performed by the multiplexers MPm as described above.

After the first word in the page data PD(h+1) is determined, the mask ROM 101 goes into the page mode allowing the high-speed read. Thus, the data in the memory cell is output at a high speed.

As described above, in the mask ROM 101 in the first example, in the case where the page designation part of the input address signal matches one of the replacement target page addresses stored in each page memory determination circuit AM1 through AMj of the replacement page designation storage section 110, one of the replacement word selection lines RWDn is made active ("high" level) in accordance with the in-page word designation address stored in the corresponding word designation memory circuit WMn in the redundant circuit section 101a, and also one of the replacement bit selection lines RDm of the data is made active in accordance with the replacement bit designation data, and thus the corresponding word in the page data DmSn from the sensing amplifier group is replaced with the replacement cell data (RDAT).

In this manner, one of defective bits (defective word) in the page data is replaced with the replacement cell data RDAT stored in the redundant circuit section 101a.

Since the capacity of the replacement target page address and the replacement cell data which can be stored in a redundant circuit section is generally smaller than the capacity of the main memory, the number of defective bits which can be compensated for is small. Accordingly, such a system is suitable for compensating for a relatively small number of defective bits scattered in the entire memory section. The system of compensating for one bit (word) per page data performed as in the first example has a significant effect for such a small number of defects.

It is easy to reduce the access time to replacement cell data and the like in the redundant circuit section to be shorter than the access time to the main memory during a random access operation. Provision of the redundant circuit section in the semiconductor memory device as according to the present invention does not delay the access time.

During page access, input of the selector SLNm which has; already been determined is selected in accordance with the in-page address (A0 through A2) of the input address signal, and thus a piece of data (word) included in the page data is output from the output circuit OUTm. Accordingly, the data to be output has already been determined at the time of page-mode read, and thus data read is not performed from the main memory section 10 or the redundant circuit section 101a.

Accordingly, delay in the access time during page access is not generated by the provision of the redundant circuit section. Thus, a read-only memory operable in the high-speed page access mode and including a redundant circuit section is realized.

Moreover, in the first example, the plurality of pieces of replacement cell data stored in one data memory circuit by a unit of one bank area match only one piece of the data (word) included in the replacement target page. Accordingly, efficient compensation for the defective memory cell can be performed by simply reading replacement target page data from the main memory 10 during the random access operation and reading the replacement cell data included in the replacement target page data corresponding to the defective word, and then replacing one word in the replacement target page data.

In the above description, a NOR-type mask ROM is described as an example of the mask ROM. The present invention is also applicable to a NAND-type, i.e., vertical mask ROM. In the case of a NAND-type mask ROM, the same effect can be obtained by setting a prescribed number of memory cells arranged vertically as a bank area.

Example 2

Figure 10:
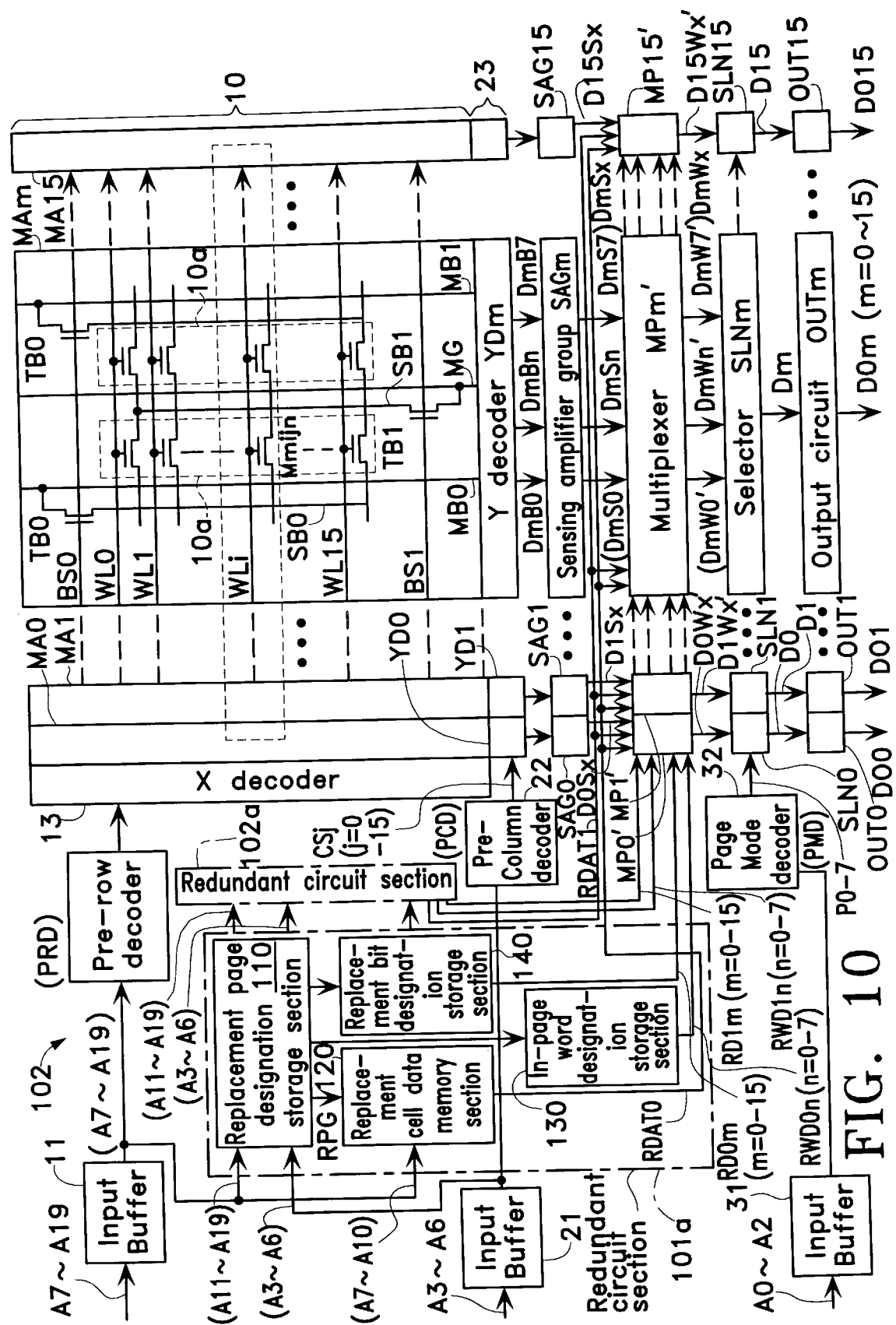
FIG. 10 is a block diagram illustrating an overall configuration of a mask ROM in a second example according to the present invention.

FIG. 10 is a block diagram of a mask ROM as a semiconductor device in a second example according to the present invention, and shows a detailed configuration of a memory cell array included in a main memory of the mask ROM.

As shown in FIG. 10, a mask ROM 102 operable in a page mode adopting a redundancy compensation system receives an address signal (A0 through A19) and outputs 16-bit output data DO.

In addition to the redundant circuit section 101a in the mask ROM 101 in the first example, the mask ROM 102 includes a redundant circuit section 102 having the same configuration as that of the redundant circuit section 101a.

The redundant circuit section 102 includes storage and memory sections 110, 120, 130 and 140 corresponding to the replacement page designation storage section 110, the replacement cell data memory section 120, the in-page word designation storage section 130 and the replacement bit designation storage section 140. In place of the multiplexers MP0 through MP15, the mask ROM 102 includes multiplexers MP0', MP1', ..., MPm', ..., MP15' each of which can select either one of replacement cell data RDAT0 from the redundant circuit section 101a or the replacement cell data RDAT1 from the redundant circuit section 102a. Except for these points, the configuration of the mask ROM 102 is the same as that of the mask ROM 101 in the first example.

The multiplexers MP0' through MP15' receive sense cell data D0Sn through D15Sn (n: an integer from 0 through 7) from the sending amplifier groups SAG0 through SAG15 and the replacement cell data RDAT0 and RDAT1 from the memory sections 120 of each of the redundant circuit sections 101a and 102a. The multiplexers are structured to be able to replace up to two words per replacement target page data, based on the in-page word designation addresses from the replacement word lines RWD1n and RWD2n and the replacement bit designation data from the replacement bit lines RD1m and RD2m of the storage sections 130 and 140 of each of the redundant circuit sections 101a and 102a.

Figure 11:
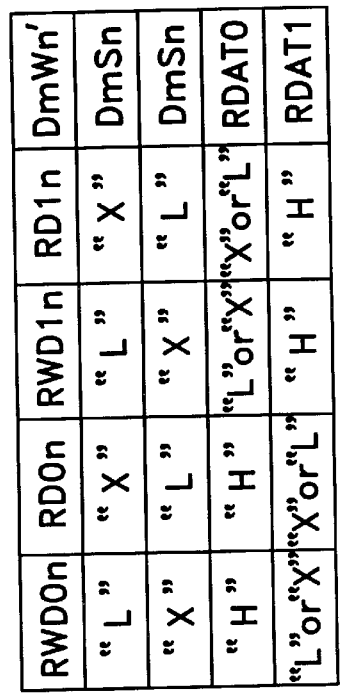
FIG. 11A is a view illustrating an inner configuration of a multiplexer of the mask ROM shown in FIG. 10.
FIG. 11B is a view illustrating a specific configuration of a replacement circuit included in the multiplexer.
FIG. 11C is a view illustrating signals input to and output from the replacement circuit.
Figure 12:
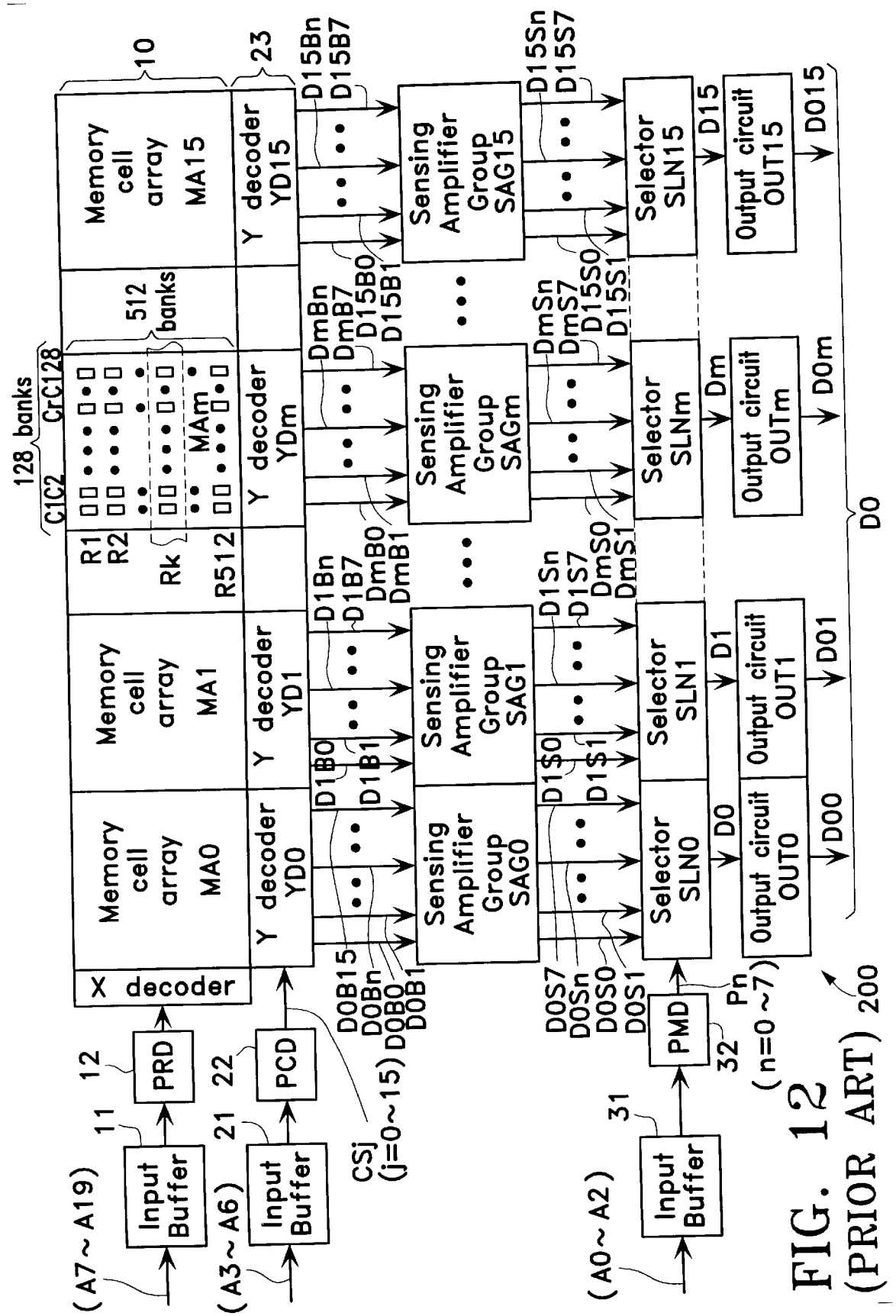
FIG. 12 is a block diagram illustrating an overall configuration of a conventional mask ROM operable in a page mode.
Figure 13:
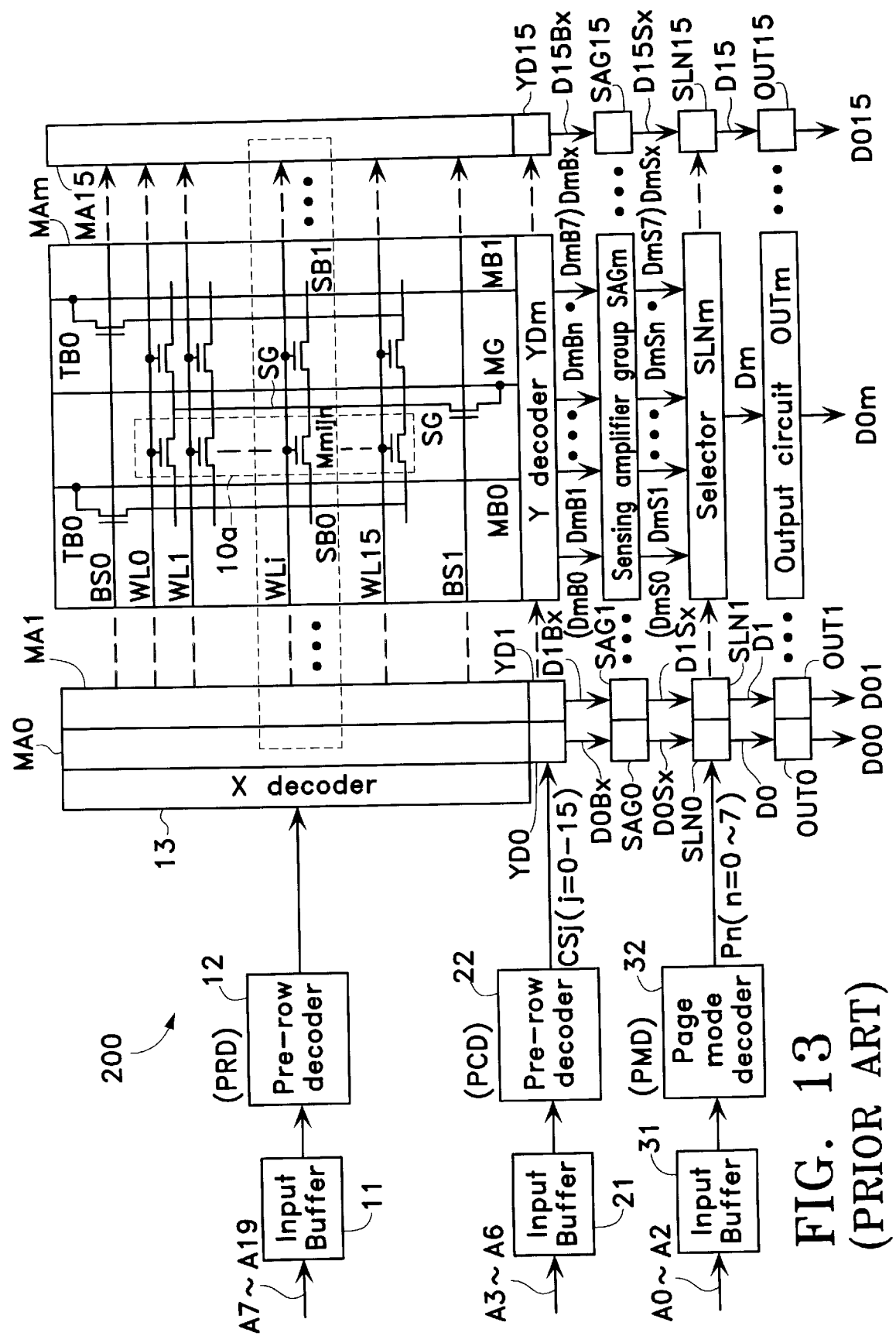
FIG. 13 is a block diagram illustrating a detailed configuration of a memory cell array in a main memory section of the conventional mask ROM shown in FIG. 12.

FIG. 11A shows a specific circuit configuration of the above-described multiplexer. As shown in FIG. 11A, the multiplexer MPm', for example, includes a plurality of replacement circuits MPX0' through MPX7' for replacing the sense cell data DmS0 through DmS7 (m=0 through 15) from the sensing amplifiers SAGm (m=0 through 15) with the replacement cell data RDAT0 and RDAT1 from the redundant circuit sections 101a and 102a.

As shown in FIG. 11B, the replacement circuit MPXn' as one of the replacement circuits includes first and second n-type MOS transistors 161a and 162a connected in series between an input node 160a0 and an output node 160c of the replacement cell data RDAT0, and also include third and fourth n-type MOS transistors 163a and 164a connected in parallel between an input node 160a1 and the output node 160c of the replacement cell data RDAT1, and first, second, third and fourth p-type MOS transistors 161b, 162b, 163b and 164b connected in parallel between the input node 160b and the output node 160c of the sense cell data DmSn.

A replacement word selection line RWDn from the redundant circuit section 101a is connected to gates of the first n-type MOS transistor 161a and the first p-type MOS transistor 161b, and a replacement bit selection line RDn from the redundant circuit section 101a is connected to gates of the second n-type MOS transistor 162a and the second p-type MOS transistor 162b. A replacement word selection line RWD1n from the redundant circuit section 102a is connected to gates of the third n-type MOS transistor 163a and the third p-type MOS transistor 163b, and a replacement bit selection line RD1n from the redundant circuit section 102a is connected to gates of the fourth n-type MOS transistor 164a and the fourth p-type MOS transistor 164b.

As shown in FIG. 11C, it is selected whether the sense cell data DmSn is output as it is or output after replacement with the replacement cell data RDAT0 or RDAT1, based on the signal level of the selection lines RW0Dn, RWD1n, RD0n, and RD1n. In FIG. 11C, symbol "DmWn'" represents the output from the replacement circuit MPXn' of the multiplexer MPm'. Symbols "L" and "H" respectively represent that the signal level of the selection lines RWD0n, RWD1n, RD0n, and RD1n is low and high. Symbol "X" represents that the signal level of the selection lines RWD0n, RWD1n, RD0n, and RD1n can be either low or high.

As the mask ROM 101, the mask ROM 102 in the second example further includes selectors SLN0 through SLN15 (n is an integer from 0 through 7) for selecting the outputs from the multiplexers MP0' through MP15' corresponding to each bit. To the selectors SLN0 through SLN15, corresponding output circuits OUT0 through OUT15 are connected. The output circuits OUT0 through OUT15 perform signal processing, such as amplification, of cell data D0 through D15 selected by the selectors SL0 through SL15, and output the resultant signals as output cell data DO0 through DO15.

In the mask ROM 102 in the second example, a usual read operation in the page mode is performed in the same manner as in the first example.

Since two redundant circuit sections 101a and 102a are provided for one main memory section 10 in the mask ROM 102, data corresponding to up to two bits (words) can be replaced per page data.

As in the first example, in the case where the page address of the input address signal matches the replacement target page address stored in the replacement page designation storage section 110 of the redundant circuit section 101a or 102a, the replacement cell data in the replacement cell data memory section 120 is read to the multiplexer MPm' based on the page designation address. Then, the prescribed word is replaced with the read replacement cell data by the multiplexer MPm' in accordance with the information stored in the in-page word designation storage section 130 and the replacement bit designation storage section 140 in the corresponding redundant circuit section.

In the case where the page address of the input address signal matches one of the replacement target page addresses stored in the replacement page designation storage section 110 of the redundant circuit section 101a or 102a, the redundant circuit section, e.g., the redundant circuit section 101a makes active ("high" level) one of the replacement word selection line RWD0n in accordance with the in-page word designation address stored in the in-page word designation storage section 130, and also makes active one of the replacement bit selection lines RD0m of the bit in accordance with the replacement bit designation data stored in the replacement bit designation storage section 140. Then, the corresponding replacement circuit MPXn' of the multiplexer MPm' replaces the prescribed word data Wn in the page data DmSn (n: an integer from 0 through 7) from the sensing amplifier group SAGm with the replacement cell data RDAT0 from the redundant circuit section 101a.

In the case where the page address of the input address signal matches also one of the replacement target page addresses stored in the replacement page designation storage section 110 of the other redundant circuit section 102a, a different word data in the page data DmSn (n: an integer from 0 through 7) from the sensing amplifier SAGm is replaced with the replacement cell data RDAT0 from the redundant circuit section 102a in the same manner.

In mask ROM 102 in the second example, up to two pieces of word data can be replaced per page data.

As described above, according to the present invention, in a semiconductor memory device operable in a high-speed access mode, such as a page access mode, adopting a redundancy compensation system, a defective memory cell included in a selected page can be compensated for without delay in access time during page access. Thus, the production yield can be improved without sacrificing access time.

In the case of a non-volatile memory, defects are often generated on the basis of a unit of one bank. Accordingly, defects rarely concentrate in page data including cell data in memory cells arranged in a line in a direction perpendicular to the arrangement of the memory cells included in each bank area. Moreover, since the capacity of the replacement cell data is generally significantly smaller than the capacity of the main memory, a sufficient compensation effect often can be obtained without allowing for replacement of a great number of words in the same page data, although compensation for defects in a great number of words (cell data of each memory cell) included in the page data is difficult by such a system.

According to the present invention, the replacement cell data is stored based on a unit of one bank, and determination on whether data should be replaced or not is conducted based on whether or not the replacement target page address which is common to all the pages overlapping the replacement target bank area match the corresponding parts of the input address signal. By such a system, compensation for defective parts can be performed by the same process using the replacement cell data stored on a unit of a bank area. Furthermore, determination on whether the defective part should be compensated for or not can be efficiently conducted by a unit of page group overlapping the bank area including the defective memory cell.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device, comprising:
   a main memory section for storing data, the main memory section including a plurality of memory cells arranged in a matrix;
   a redundant memory section including a replacement cell data memory section for storing replacement cell data to replace cell data in a prescribed memory cell in the main memory section, and a control signal generation section for generating a control signal for data replacement based on an input address;
   a memory cell selection section for simultaneously selecting prescribed cells as a plurality of memory cells corresponding to a prescribed page in the main memory section based on the input address;
   a sensing amplification section for simultaneously sensing the cell data corresponding to the selected plurality of memory cells as page data;
   a data replacement section for receiving the replacement cell data and the control signal from the redundant memory section and also receiving the page data from the sensing amplification device; when the page data includes cell data which needs to be replaced, outputting replacement page data after replacing the cell data with the replacement cell data based on the control signal; and when the page data includes no cell data which needs to be replaced, outputting the page data with no processing based on the control signal; and
   a data selection section for sequentially switching and outputting the corresponding data from the page data output from the data replacement section based on the input address,
      wherein a supply of the replacement cell data and the control signal from the redundant memory section to the data replacement section is performed in a time period from the time when the input address is determined until the time when the page data to be output from the sensing amplification section is determined.

2. A semiconductor memory device according to claim 1, wherein:
   the main memory section includes a plurality of bank areas each including a prescribed number of memory cells, the bank area being used as a unit for reading the cell data,
   the replacement cell data memory section in the redundant memory section stores replacement cell data on a bank area-by bank area basis so as to include the replacement cell data corresponding to all the memory cells in a replacement target bank area including a memory cell to be replaced,
   the control signal generation section of the redundant memory section includes a determination section for determining whether or not a row of a plurality of memory cells arranged in a matrix which are simultaneously selected overlaps the replacement target bank area including the memory cell to be replaced; and when the row of the plurality of memory cells overlaps the replacement target bank area, controls the data replacement section to replace the cell data stored in the memory cell to be replaced with the replacement cell data.

3. A semiconductor memory device according to claim 1, wherein the control signal generation section of the redundant memory section includes a replacement page designation storage section for storing a page designation address which designates a replacement target page including the memory cell to be replaced in the main memory section; and when a part of the input address which designates a page matches the page designation address, controls the data replacement section to replace the cell data stored in the memory cell to be replaced with the replacement cell data.

4. A semiconductor memory device according to claim 3, wherein:
   the main memory section includes a plurality of memory cell arrays each having the plurality of memory cells in a matrix, the plurality of memory cells corresponding to each of a plurality of bits of data so that data corresponding to a plurality of bits is allowed to be stored,
   the memory cell selection section includes a plurality of column selection devices for simultaneously selecting columns to which memory cells included in a page belong in the corresponding memory cell array, the plurality of column selection devices being provided respectively for the plurality of bits of the data, and
   the sensing amplification device includes a plurality of sensing amplifier groups each including a plurality of sensing amplifiers, the plurality of sensing amplifier groups, respectively provided for the plurality bits of data, simultaneously sensing the cell data in the plurality of memory cells selected by the corresponding column selection device as the page data,
   the data replacement section includes a plurality of replacement circuits for performing data replacement of the page data output from the corresponding sending amplification section when necessary based on the control signal, the plurality of replacement circuits being respectively provided for the plurality of bits of data,
   the data selection section includes a plurality of selection circuits for sequentially switching and outputting cell data corresponding to each memory cell in the page data output from the corresponding replacement circuit based on the input address, the plurality of selection circuits being provided respectively for the plurality of bits of data, and the control signal generation section of the redundant memory section further includes an in-page word designation storage section for storing an in-page word designation address which designates the memory cell to be replaced in the replacement target page, and also includes a replacement bit designation storage section for storing replacement bit designation data which designates a replacement bit to be replaced in the data corresponding to the plurality of bits read from the main memory section; and when a part of the input address which designates a page matches the page designation address stored in the replacement page designation storage section, outputs the in-page word designation address and the replacement bit designation data to each of the replacement circuits.

5. A semiconductor memory device according to claim 4, wherein:

the replacement page designation storage section includes a plurality of page memory determination circuits, each storing one page designation address, the in-page word designation storage section includes a plurality of in-page word designation memory circuits each storing one in-page word designation address, the replacement bit designation storage section includes a plurality of replacement bit designation circuits each storing one piece of replacement bit designation data, the replacement cell data memory section includes a plurality of replacement cell data memory circuits each storing one piece of replacement cell data, and the data replacement section is allowed to replace cell data for a plurality of pieces of page data based on the in-page word designation address and the replacement bit designation data.

6. A semiconductor memory device according to claim 4, wherein the data replacement section is a multiplexer circuit including a plurality of replacement circuits for performing data replacement with respect to the page data output from the corresponding sensing amplifier group when necessary based on the control signal, the plurality of replacement circuits being provided respectively for the plurality of bits of data.

7. A semiconductor memory device according to claim 4, wherein each data replacement circuit receives the page data from the corresponding sensing amplifier group and the replacement cell data stored in the replacement cell data memory section; when the in-page word designation address and the replacement bit designation data are active, replaces the cell data from each of the memory cells included in the page data from the sensing amplifier group with the replacement cell data stored in the replacement cell data memory section; and when the in-page word designation address and the replacement bit designation data are inactive, outputs the page data from the sensing amplifier group with no processing.

8. A semiconductor memory device according to claim 1, wherein the replacement page designation storage section in one redundant memory section stores only one replacement page designation address.

9. A semiconductor memory device according to claim 1, further comprising another redundant memory section, wherein at least two pieces of cell data from the plurality of memory cells in one piece of page data read from a prescribed sensing amplifier group is allowed to be replaced.

10. A semiconductor memory device according to claim 2, wherein each bank area includes a plurality of memory cells arranged in a line in a direction perpendicular to the direction in which the memory cells included in a page are arranged.

* * * * *